(12) United States Patent
Xiong et al.

(10) Patent No.: US 12,307,951 B2
(45) Date of Patent: May 20, 2025

(54) DISPLAY PANEL, DISPLAY DEVICE, AND OPTICAL COMPENSATION METHOD

(71) Applicant: Shanghai Tianma Micro-electronics Co., Ltd., Shanghai (CN)

(72) Inventors: Nana Xiong, Shanghai (CN); Jujian Fu, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 0 days.

(21) Appl. No.: 18/431,156

(22) Filed: Feb. 2, 2024

(65) Prior Publication Data

US 2025/0029544 A1 Jan. 23, 2025

(30) Foreign Application Priority Data

Jul. 21, 2023 (CN) .......................... 202310904090.6

(51) Int. Cl.
*G09G 3/32* (2016.01)
*G06F 3/041* (2006.01)
(Continued)

(52) U.S. Cl.
CPC .............. *G09G 3/32* (2013.01); *G06F 3/0412* (2013.01); *G06F 3/042* (2013.01); *G09G 3/3233* (2013.01);
(Continued)

(58) Field of Classification Search
CPC .... G06F 3/042; G06F 3/0412; G06F 3/04886; G09G 2360/14; G09G 2360/142; G09G 2320/0233; G09G 2300/0819; G09G 2300/0426; G09G 2360/148; G09G 2310/0232; G09G 2300/0439; G09G 2320/0686; G09G 2300/0809; G09G 3/32; G09G 3/3233; G09G 2310/0251;
(Continued)

(56) References Cited

U.S. PATENT DOCUMENTS 10,685,992 B2 * 6/2020 Aoki .................... H10F 39/8037
11,056,055 B2 * 7/2021 Chung ................. G09G 3/3266
(Continued)

FOREIGN PATENT DOCUMENTS

| CN | 108428721 A | 8/2018 |
|----|-------------|--------|
| CN | 110164370 A | 8/2019 |
| CN | 114078410 A | 2/2022 |

*Primary Examiner* — Dismery Mercedes
(74) *Attorney, Agent, or Firm* — Anova Law Group, PLLC

(57) ABSTRACT

A display panel, a display device, and an optical compensation method are provided. The display panel includes a display area, a light-emitting element, a pixel circuit, and an optical detection unit. The display area includes a first display area and a second display surrounding the first display area. The light-emitting element includes a first light-emitting element in the first display area and a second light-emitting element in the second display area. The pixel circuit includes a first pixel circuit and a second pixel circuit connected to the first and second light-emitting elements, respectively. The number of the first light-emitting elements connected to the first pixel circuit is greater than that of the second light-emitting elements connected to the second pixel circuit. The optical detection unit includes a first optical detection unit for detecting the brightness of the first light-emitting element.

17 Claims, 17 Drawing Sheets

(51) Int. Cl.
  *G06F 3/042*     (2006.01)
  *G09G 3/3233*    (2016.01)
  *H10K 59/121*    (2023.01)
  *H10K 59/131*    (2023.01)

(52) U.S. Cl.
  CPC ............ *G09G 2300/0809* (2013.01); *G09G 2300/0819* (2013.01); *G09G 2320/0233* (2013.01); *G09G 2320/0686* (2013.01); *G09G 2360/14* (2013.01); *G09G 2360/142* (2013.01); *G09G 2360/148* (2013.01); *H10K 59/121* (2023.02); *H10K 59/131* (2023.02)

(58) Field of Classification Search
  CPC ......... G09G 2320/0242; G09G 3/3266; H10K 59/121; H10K 59/1213; H10K 59/131; G06V 40/1318; G06V 40/1341; G06V 2201/07
  See application file for complete search history.

(56) References Cited

U.S. PATENT DOCUMENTS

| | | | | |
|---|---|---|---|---|
| 11,538,273 | B2* | 12/2022 | Yang | G06F 21/84 |
| 2006/0214893 | A1* | 9/2006 | Tseng | G09G 3/3233 |
| | | | | 345/82 |
| 2020/0104562 | A1* | 4/2020 | Sung | H10K 59/1216 |
| 2020/0410918 | A1* | 12/2020 | Gai | G09G 3/3233 |
| 2022/0130919 | A1* | 4/2022 | Zhang | G09G 3/3233 |
| 2023/0402014 | A1* | 12/2023 | Kim | G09G 3/3233 |
| 2024/0107841 | A1* | 3/2024 | Liu | H10K 59/131 |
| 2024/0135744 | A1* | 4/2024 | Lee | G06V 40/1365 |

\* cited by examiner

DISPLAY PANEL, DISPLAY DEVICE, AND OPTICAL COMPENSATION METHOD

CROSS-REFERENCE TO RELATED APPLICATION

This application claims the priority of Chinese Patent Application No. 202310904090.6, filed on Jul. 21, 2023, the content of which is incorporated herein by reference in its entirety.

TECHNICAL FIELD

The present disclosure generally relates to the field of display technology and, more particularly, relates to display panels, display devices, and optical compensation methods.

BACKGROUND

At present, display devices such as mobile phones and tablets often have a space reserved on the front for commonly used electronic photo-sensing devices, e.g., a front camera, an infrared sensing device, a fingerprint recognition device, etc. These photo-sensing devices are placed at the top of the front of a display device, forming a non-display area at a corresponding location. As a consequence, the screen-to-body ratio of the display device is decreased.

With the development of display technologies, display panels have increasingly higher screen-to-body ratios. Full-screen displays have received widespread attention due to narrow bezels or even bezel-less designs. In related technologies, in order to increase the screen-to-body ratio, an optical component area is set up in a display area of a display panel to accommodate photo-sensing devices. In an example, an optical component area is configured in a display area of a display screen, and a camera is arranged below the screen and correspondingly set in the optical component area. At a display stage, the optical component area plays a display role. When it is time to take photos or videos, the camera takes photos or videos through the optical component area. Thus, the optical component area simultaneously realizes the display and shooting functions.

In order to improve the photo-sensing performance of the optical component area, it is needed to ensure that the optical component area has high optical transmittance. That is, the transmittance of the optical component area is different from that of a regular display area. Currently, how to improve the display brightness uniformity of the optical component area and regular display area at a display stage is one of the technical issues that need to be solved urgently.

The disclosed structures and methods are directed to at least partially alleviate one or more problems set forth above and to solve other problems in the art.

SUMMARY

One aspect of the present disclosure provides a display panel that includes a display area, a light-emitting element, a pixel circuit, and an optical detection unit. The display area includes a first display area and a second display area. The second display area at least partially surrounds the first display area. The light-emitting element includes first light-emitting elements located in the first display area and second light-emitting elements located in the second display area. The pixel circuit includes a first pixel circuit and a second pixel circuit. The first pixel circuit is electrically connected to at least one of the first light-emitting elements. The second pixel circuit is electrically connected to at least one of the second light-emitting elements. The number of the first light-emitting elements connected to the first pixel circuit is greater than the number of the second light-emitting elements connected to the second pixel circuit. The optical detection unit includes a first optical detection unit in the first display area. The first optical detection unit is used for detecting the brightness of at least one of the first light-emitting elements in the first display area.

Another aspect of the present disclosure provides an optical compensation method for a display panel. The display panel includes a control chip, a photo-sensing element, a feedback circuit electrically connected to the photo-sensing element, a light-emitting element, and a pixel circuit electrically connected to the light-emitting element. The photo-sensing element is electrically connected to the control chip through the feedback circuit. The light-emitting element is electrically connected to the control chip through the pixel circuit. The method includes a feedback stage, a data analysis stage, and a compensation stage. At the feedback stage, the photo-sensing element is turned on, obtains optical information, generates a brightness signal according to the optical information, and sends the brightness signal to the control chip through the feedback circuit. At the data analysis stage, the control chip compares the brightness signal with a preset value, and generates a compensation signal based on a difference between the brightness signal and the preset value. At the compensation stage, the control chip sends the compensation signal to the pixel circuit. The pixel circuit drives the light-emitting element to emit light according to the compensation signal.

Another aspect of the present disclosure provides a display device that contains a display panel. The display panel includes a display area, a light-emitting element, a pixel circuit, and an optical detection unit. The display area includes a first display area and a second display area. The second display area at least partially surrounds the first display area. The light-emitting element includes first light-emitting elements located in the first display area and second light-emitting elements located in the second display area. The pixel circuit includes a first pixel circuit and a second pixel circuit. The first pixel circuit is electrically connected to at least one of the first light-emitting elements. The second pixel circuit is electrically connected to at least one of the second light-emitting elements. The number of the first light-emitting elements connected to the first pixel circuit is greater than the number of the second light-emitting elements connected to the second pixel circuit. The optical detection unit includes a first optical detection unit in the first display area. The first optical detection unit is used for detecting the brightness of at least one of the first light-emitting elements in the first display area.

Other aspects or embodiments of the present disclosure can be understood by those skilled in the art in light of the description, the claims, and the drawings of the present disclosure.

BRIEF DESCRIPTION OF THE DRAWINGS

The accompanying drawings, which are incorporated in and constitute a part of the specification, illustrate embodiments of the present disclosure and, together with the description, serve to explain the principles of the present disclosure. The drawings are merely examples for illustrative purposes according to various disclosed embodiments and are not intended to limit the scope of the present disclosure.

DETAILED DESCRIPTION

Figure 1:
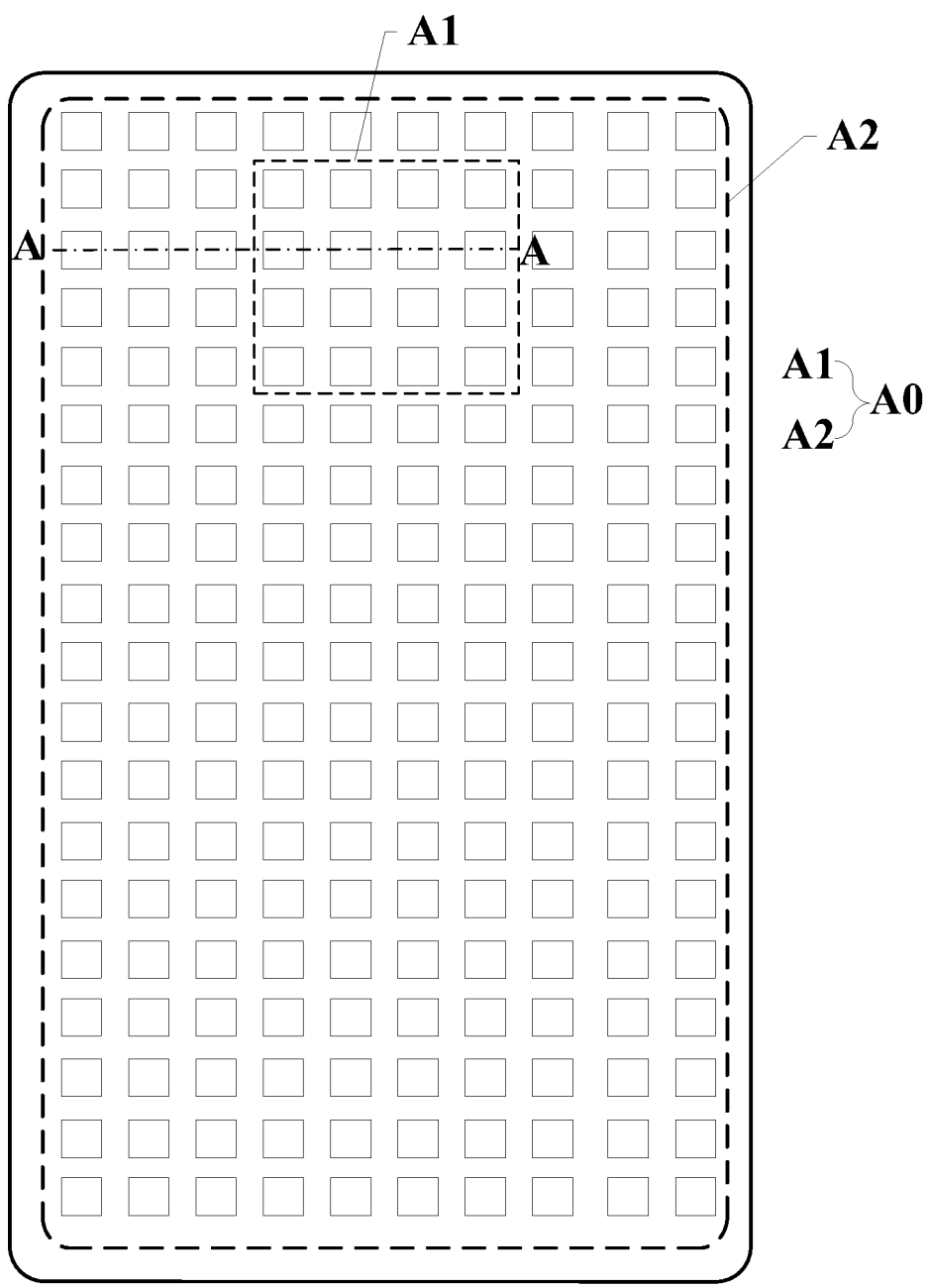
FIG. 1 shows a top view of a display panel according to various disclosed embodiments of the present disclosure.

Reference will now be made in detail to exemplary embodiments of the disclosure, which are illustrated in the accompanying drawings. Unless otherwise specifically stated, the relative arrangement of components and steps, numerical expressions, and numerical values set forth in these embodiments do not limit the scope of the invention.

The following description for at least one exemplary embodiment is merely illustrative in nature and is in no way intended to limit the invention, its application, or uses.

Techniques, methods, and devices known to those of ordinary skill in the relevant art may not be discussed in detail, but where appropriate, such techniques, methods, and devices should be considered a part of the specification.

In all examples shown and discussed herein, any specific values are to be construed as illustrative only and not as limiting. Accordingly, other examples of the exemplary embodiments may have different values.

It should be noted that similar reference numerals and letters indicate similar items in the following figures. Therefore, once an item is defined in one figure, it does not require further discussion in the following figures.

Figure 2:
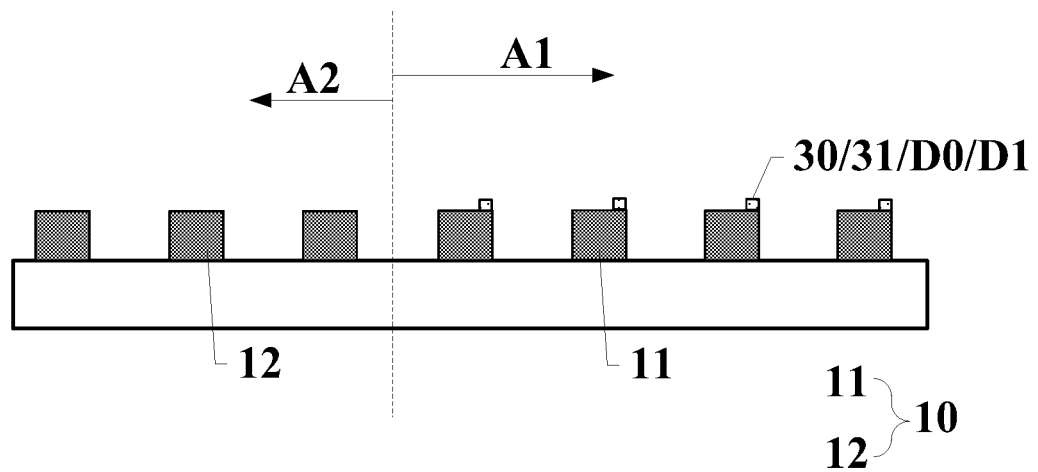
FIG. 2 shows a cross-sectional view taken along line AA' on the display panel of FIG. 1 according to various disclosed embodiments of the present disclosure.
Figure 3:
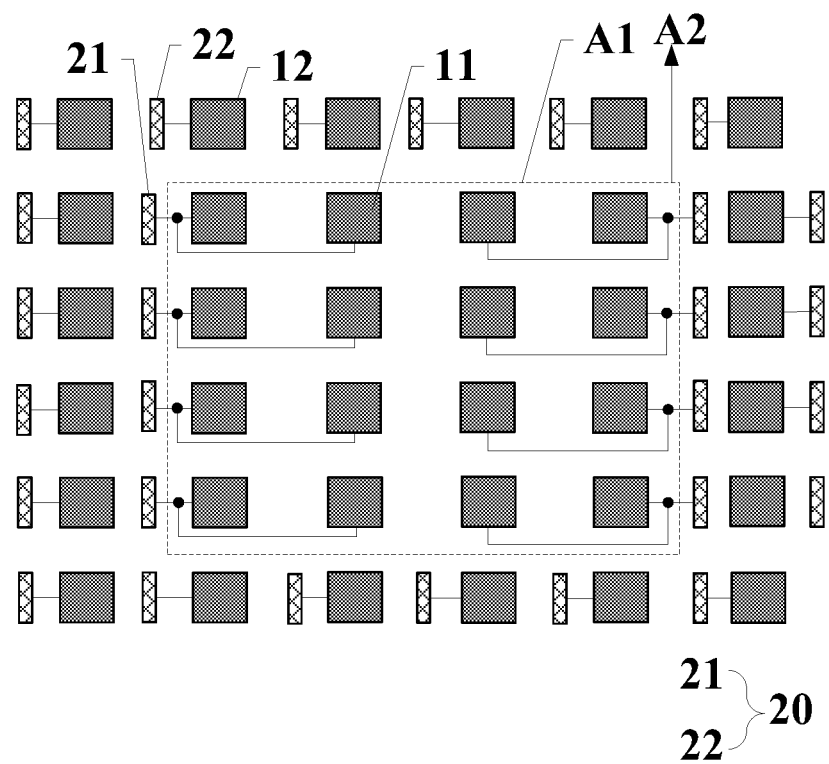
FIG. 3 shows a schematic diagram illustrating connections between pixel circuits and light-emitting elements according to various disclosed embodiments of the present disclosure.

FIG. 1 illustrates a top view of a display panel 100 according to the present disclosure, FIG. 2 illustrates a cross-sectional view taken along line AA' on the display panel 100 of FIG. 1 according to the present disclosure, and FIG. 3 illustrates a schematic diagram showing connections between pixel circuits and light-emitting elements according to the present disclosure. Referring to FIGS. 1-3, the display panel 100 includes a display area A0, a light-emitting element 10, a pixel circuit 20, and an optical detection unit 30.

The display area AG contains a first display area A1 and a second display area A2. The second display area A2 at least partially surrounds the first display area A1. The second display area A2 may completely surround the first display area A1 in some cases, while partially surrounding the first display area A1 in some other cases. In some embodiments, the first display area A1 may be arranged at a position different from that shown in FIG. 1 and surrounded by the second display area A2 at least partially.

The light-emitting element 10 includes a first light-emitting element 11 located in the first display area A1 and a second light-emitting element 12 located in the second display area A2. The pixel circuit 20 includes a first pixel circuit 21 and a second pixel circuit 22. The first pixel circuit 21 is electrically connected to the first light-emitting element 11, and the second pixel circuit 22 is electrically connected to the second light-emitting element 12. The number of the first light-emitting elements 11 connected to the first pixel circuit 21 is greater than the number of the second light-emitting elements 12 connected to the second pixel circuit 22. The optical detection unit 30 includes a first optical detection unit 31 located in the first display area A1. The first optical detection unit 31 is used to detect the brightness of the first light-emitting element 11 in the first display area A1.

The display panel 100 as shown in FIG. 1 has an exemplary rounded rectangular shape, which does not limit the structure and shape of the display panel of the present disclosure. In some cases, the shape of a display panel (e.g., the display panel 100) may also be embodied as a rectangle, a circle, an oval, other structures containing arc edges, etc.

FIG. 1 only illustrates a relative position of the first display area A1 on the display panel 100. In some other embodiments, the first display area A1 may also be disposed at other locations on the display panel 100. The shape of the first display area A1 may also be set according to the actual situation. The square shape of the first display area A1 as shown in FIG. 1 is only for illustration. In some other cases, the first display area A1 may also have a circular shape, a racetrack shape, etc. In addition, the size of the first display area A1 may also be arranged according to actual needs.

FIG. 2 schematically shows a relationship diagram illustrating relative positions of the first light-emitting elements 11, the second light-emitting elements 12, and the first optical detection unit 31 on the display panel 100. It does not represent the actual sizes, nor does it limit the layer structure of the display panel. FIG. 3 shows the relative positional relationship between the pixel circuits 21 and the light-emitting elements 11 and 12. It does not represent the actual number of the first and second light-emitting elements 11 and 12.

In some embodiments, the display panel 100 is provided with the first display area A1 and second display area A2. As shown exemplarily in FIG. 1, the second display area A2 surrounds the first display area A1. Alternatively, the second display area A2 may surround the first display area A1 partially. In some further embodiments, the first display area A1 is used to set electronic photo-sensing devices such as a camera, an infrared sensing device, a fingerprint recognition device, etc. The first display area A1 is provided with the first light-emitting elements 11, and the second display area A2 is provided with the second light-emitting elements 12. At the display stage, both the second display area A2 and the first display area A1 perform display functions. The first light-emitting element 11 is driven by the first pixel circuit 21 to emit light. The second light-emitting element 12 is driven by the second pixel circuit 22 to emit light. At the photo-sensing stage, the first display area A1 serves as a light-transmitting region to realize the photo-sensing function. At this stage, the first light-emitting element 11 in the first display area A1 does not emit light. For example, when the first display area A1 is equipped with a camera, the first display area A1 serves as a light-transmitting area to realize picture shooting functions at the photo-sensing stage. Integrating the first display area A1 into the display area may reduce the space of the non-display area of the display panel, and facilitate the realization of a narrow frame or frameless design of the display panel.

When the first display area A1 is arranged in the display area for setting up electronic photo-sensing devices such as a camera, an infrared sensing device, and a fingerprint recognition device, high transmittance of the first display area A1 is required due to photo-sensing requirements of the electronic photo-sensing devices. As a result, different designs are arranged for light-emitting elements connected to the first and second pixel circuits 21 and 22. The number of the first light-emitting elements 11 connected to the first pixel circuit 21 is greater than the number of the second light-emitting elements 12 connected to the second pixel circuit 22. As shown in FIG. 3 exemplarily, the first pixel circuit 21 is connected to two first light-emitting elements 11, while the second pixel circuit 22 is connected to one second light-emitting element 12. That is, the first pixel circuit 21 drives two first light-emitting elements 11, while the second pixel circuit 22 drives one second light-emitting element 12. The transmittance of the first display area A1 is increased by reducing the number of the first pixel circuits 21 corresponding to the first display area A1.

In some cases, since the numbers of light-emitting elements respectively connected to the first and second pixel circuits 21 and 22 are different, the driving voltages/currents received by the first and second light-emitting elements 11 and 12 are different. For example, the luminous brightness of the first light-emitting element 11 may be lower than that of the second light-emitting element 12. Then, the display brightness of the first display area A1 may be lower than that of the second display area A2, affecting the display uniformity of the display panel.

In some embodiments of the present disclosure, the first optical detection unit 31 is configured in the first display area A1. The first optical detection unit 31 is used to detect the brightness of the first light-emitting element 11 in the first display area A1. When the first optical detection unit 31 detects that the luminous brightness of the first light-emitting element 11 is lower than that of the second light-emitting element 12 in the second display area A2, the luminous brightness of the first light-emitting element 11 in the first display area A1 is compensated to balance the display brightness difference between the first and second display areas A1 and A2. It may improve the overall display brightness uniformity of the display area and the overall display effect of the display panel.

Figure 4:
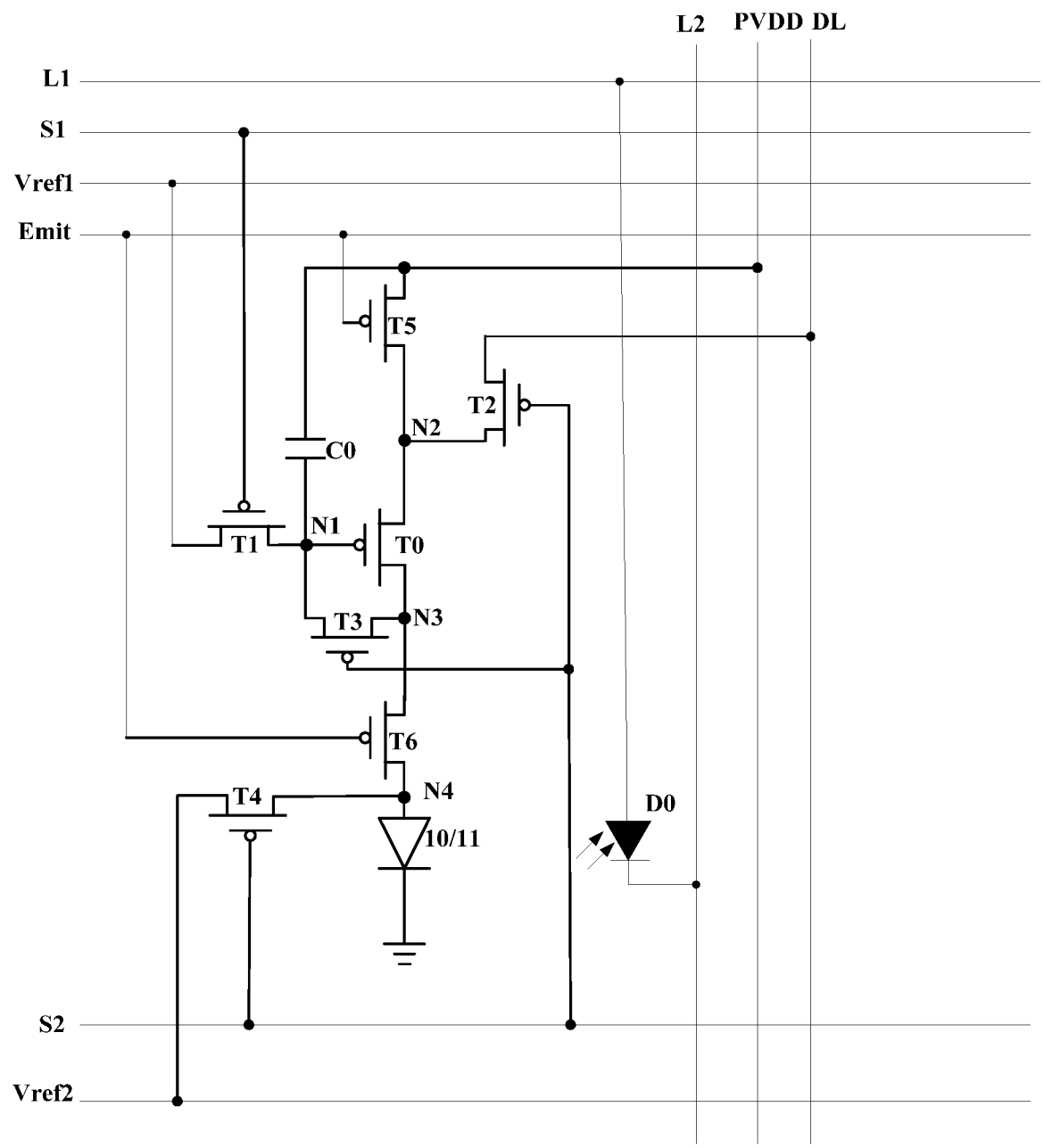
FIG. 4 shows a schematic diagram of an arrangement of an optical detection unit and a first pixel circuit according to various disclosed embodiments of the present disclosure.

FIG. 4 illustrates a schematic diagram of an arrangement of an optical detection unit and the first pixel circuit 11 according to the present disclosure. For example, the first pixel circuit 11 is a 7T1C pixel circuit that includes seven transistors and a storage capacitor C0. The seven transistors include transistors T0 to T6. The transistor T0 is used as a driving transistor, its gate is connected to a first node, and its first and second electrodes are connected to a second node and a third node, respectively. The first transistor T1 serves as an initialization transistor. Its gate is connected to a first scan line S1, its first electrode is connected to a first reset signal line Vref1, and its second electrode is connected to a first node N1. The second and third transistors T2 and T3 serve as data writing modules. The gates of the second and third transistors T2 and T3 are connected to a second scanning line S2, the first electrode of the second transistor T2 is connected to a data line DL, and the second electrode of the second transistor T2 is connected to a second node N2. The first electrode of the third transistor is connected to a third node N3, and the second electrode of the third transistor is connected to the first node N1. The fourth transistor T4 serves as a second reset transistor, with its gate connected to the second scan line S2, its first electrode connected to a second reset signal line Vref2, and its second electrode connected to a fourth node. The fourth node is connected to the anode of the light emitting element 10. The fifth transistor T5 and sixth transistor T6 serve as light-emitting control transistors, and their gates are connected to a light-emitting control signal line Emit. The first electrode of the fifth transistor T5 is connected to a first power signal line PVDD, and the second electrode of the fifth transistor T5 is connected to the second node N2. The first electrode of the sixth transistor T6 is connected to the third node N3, and the second electrode of the sixth transistor T6 is connected to a fourth node N4. FIG. 4 only illustrates the first pixel circuit schematically and does not limit the actual structure of the first pixel circuit.

Figure 5:
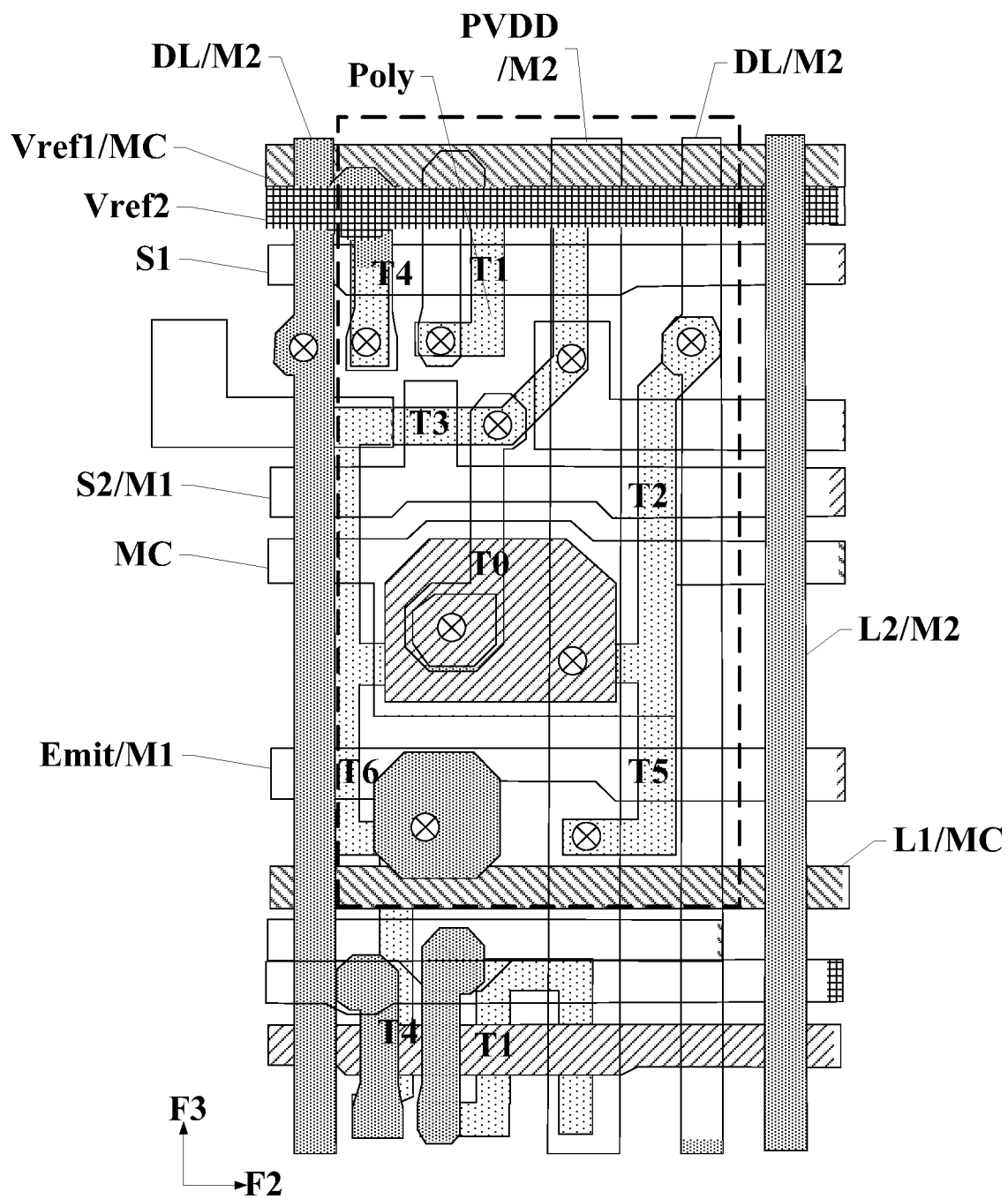
FIG. 5 shows a schematic layout diagram of pixel circuits and signal lines in optical detection units according to various disclosed embodiments of the present disclosure.

FIG. 5 illustrates a schematic layout diagram of pixel circuits and signal lines in optical detection units according to the present disclosure. Referring to FIGS. 4 and 5, the optical detection unit 30 includes a control signal line L1, a detection signal line L2, and a photo-sensing element D0. Two ends of the photo-sensing element D0 are electrically connected to the control signal line L1 and detection signal line L2, respectively. The optical detection unit 30 and the first pixel circuit are independent of each other. In some embodiments, the control signal line L1 and first scanning line S1 extend in the same direction, and the detection signal line L2 and data line DL extend in the same direction. In order to avoid signal interaction between the signal lines in the optical detection unit 30 and the signal lines in the first pixel circuit, along a direction perpendicular to the plane of the display panel, the control signal line L1 does not overlap with signal lines in the display panel that extend in the same direction, and the detection signal line L2 does not overlap with signal lines in the display panel that extend in the same direction. The layers where the control signal line L1 and detection signal line L2 are located in the display panel will be described in detail in subsequent descriptions.

Referring to FIG. 4, the optical detection unit 30 has no physical electrical connection with the pixel circuit 20. In other words, the optical detection unit 30 and pixel circuit 20 are two mutually independent structures, there is no structural reuse between the two, and their working processes are also independent of each other. As such, the working process of the optical detection unit 30 does not affect the operation of the pixel circuit. Therefore, while the optical detection unit 30 is arranged to detect the brightness of the first light-emitting element 11 in the first display area A1, the first and second pixel circuits 21 and 22 still drive the light-emitting elements in the first and second display areas A1 and A2 normally.

Figure 6:
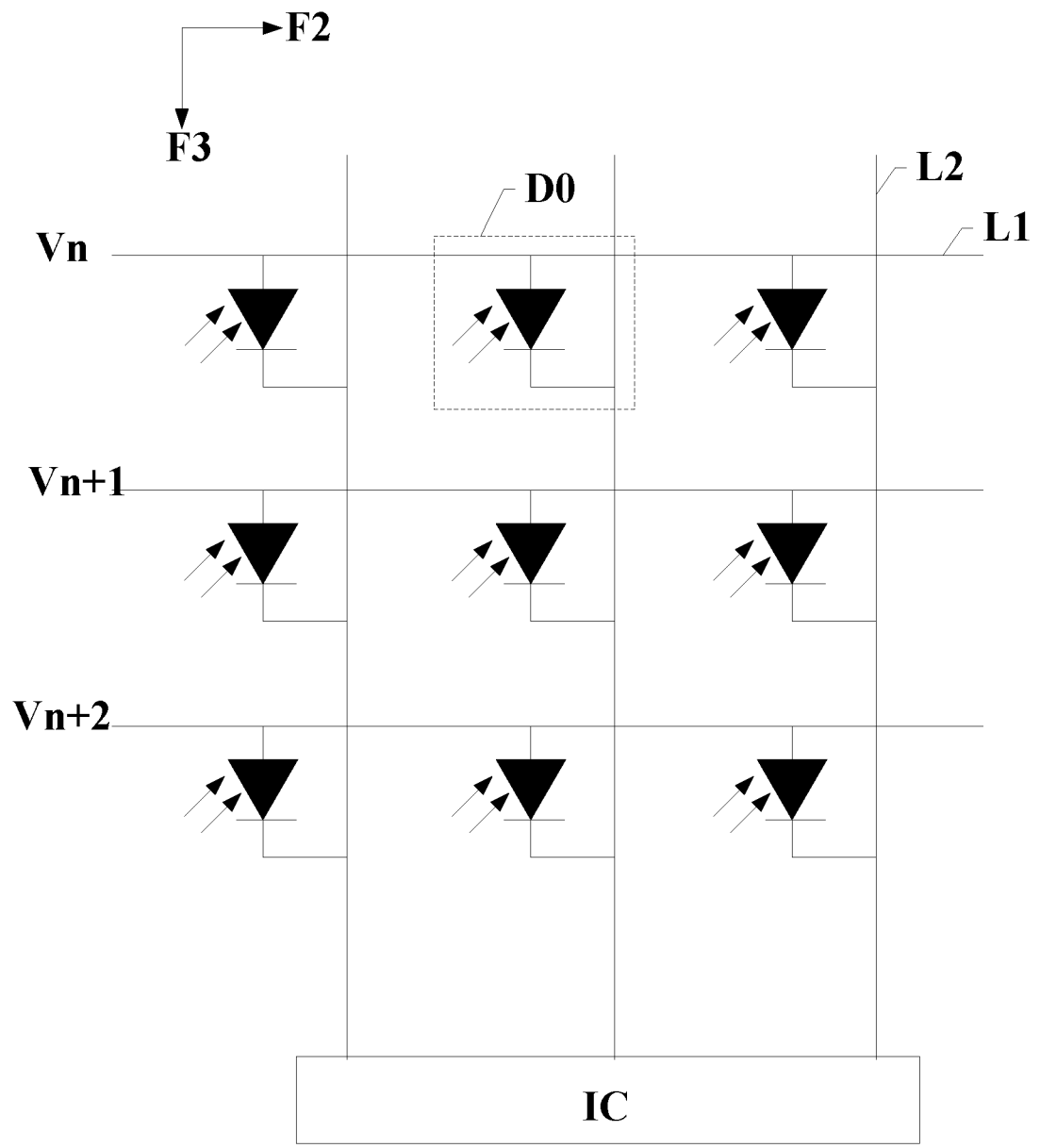
FIG. 6 shows a schematic diagram of connections between photo-sensing elements and a feedback circuit according to various disclosed embodiments of the present disclosure.

FIG. 6 illustrates a schematic diagram of connections between photo-sensing elements and a feedback circuit according to the present disclosure. The optical detection unit 30 includes the photo-sensing element D0 and a feedback circuit connected to the photo-sensing element. The photo-sensing element D0 is used to receive the brightness signal of the light-emitting element and transmit it to the feedback circuit.

In some embodiments, the display panel 100 also includes a control chip IC. The pixel circuit and feedback circuit are both electrically connected to the control chip. The control chip IC is used to receive the brightness signal transmitted by the feedback circuit, generate a driving signal based on the brightness signal, and send the driving signal to the pixel circuit corresponding to the light-emitting element.

In some embodiments, the photo-sensing element D0 is a transparent photodiode.

Referring to FIGS. 1-6, when the first light-emitting element 11 in the first display area A1 emits light at the display stage, the photo-sensing element D0 senses the brightness of the light emitted by the first light-emitting element 11, receives a brightness signal of the first light-emitting element 11, and transmits the brightness signal to the control chip IC through the feedback circuit. The first pixel circuit 21 connected to the first light-emitting element 11 obtains the driving signal through the control chip IC. When the control chip receives the brightness signal of the first light-emitting element 11 transmitted by the feedback circuit, the control chip compares the brightness signal of the first light-emitting element 11 with that of the second light-emitting element 12 in the second display area A2. If the brightness of the first light-emitting element 11 is lower than the brightness of the second light-emitting element 12, the control chip adjusts the driving signal provided to the first pixel circuit 21, and increases the driving voltage/current provided to the first pixel circuit 21 to increase the luminous brightness of the first light-emitting element 11. As such, the difference in luminous brightness between the first and second light-emitting elements 11 and 12 is decreased, and the display uniformity of the first and second display areas A1 and A2 is improved. FIG. 6 shows an exemplary feedback circuit. The specific working process of the feedback circuit will be explained in subsequent descriptions below.

Figure 7:
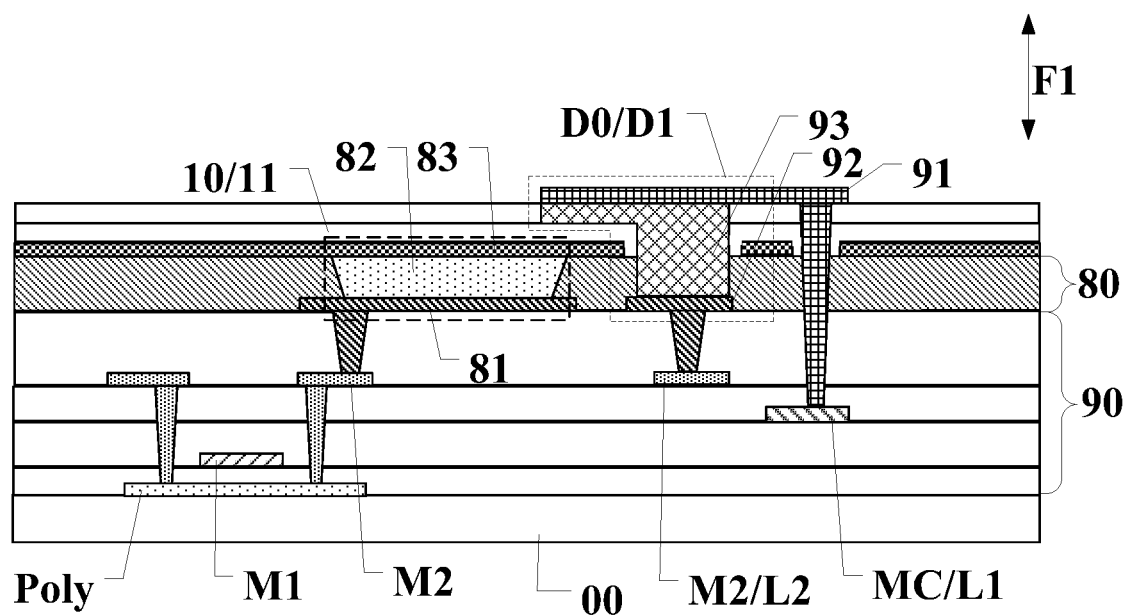
FIG. 7 shows a schematic diagram of a layer structure of a display panel according to various disclosed embodiments of the present disclosure.

FIG. 7 shows a schematic diagram of a layer structure of the display panel 100 according to the present disclosure, which reflects the relative positional relationship between the first photo-sensing element and first light-emitting element. Referring to FIGS. 2 and 7, the display panel 100 includes a substrate 00 and an array layer 90 disposed on a side of the substrate 00 in some cases. The first pixel circuit connected to the first light emitting element 11 is formed in the array layer 90. In some embodiments, the array layer 90 includes a first metal layer M1, a second metal layer M2, and a semiconductor layer poly. The first metal layer M1 is a gate metal layer exemplarily. The gates of some transistors in the display panel are disposed in the first metal layer M1. The source electrodes and drain electrodes of some transistors in the display panel are located in the second metal layer M2. The semiconductor layer poly includes source regions and drain regions. The source and drain regions are formed by doping N-type impurity ions or P-type impurity ions, respectively. The source electrode of the transistor is electrically connected to the source region of the semiconductor layer through a contact hole, and the drain electrode of the transistor is electrically connected to the drain region of the semiconductor layer through another contact hole. FIG. 7 shows the above-described transistors in the array layer 90 exemplarily. In some other cases, other types of transistors may also be formed in the array layer 90 to facilitate operations of the display panel. In addition, FIG. 7 only illustrates one layer structure of the array layer, which does not limit the number and size of layers included in the array layer 90.

Referring to FIGS. 2 and 7, the first optical detection unit 31 includes the photo-sensing element D0 that contains a first photo-sensing element D1. In the first display area A1, at least one first photo-sensing element D1 overlaps a first light-emitting element 11 along a first direction F1. The first direction F1 is perpendicular to the plane where the display panel is located.

When using a photo-sensing element to sense the brightness of the light emitted by the first light-emitting element 11, the photo-sensing element needs to be arranged in the light emitting direction of the first light-emitting element 11. In some embodiments, the first photo-sensing element D1 is disposed on a side surface of the first light-emitting element 11 facing the display panel (e.g., the upper surface of the first light-emitting element 11 as shown in FIG. 3). The side surface of the first light-emitting element 11 facing the display panel has the largest intensity of light emitted. When the first photo-sensing element D1 is disposed on the light-emitting surface of the first light-emitting element 11, the light intensity that the first photo-sensing element D1 senses is larger. Therefore, it is beneficial to improve the accuracy of sensing the brightness signal of the first light-emitting element 11 by the first photo-sensing element D1. The driving signal provided by the control chip to the first light-emitting element 11 according to the brightness signal may be more accurate. It is more conducive to reducing the display brightness difference between the first and second display areas A1 and A2, and improving the overall display uniformity of the display panel.

In some embodiments, the first photo-sensing element D1 overlaps the first light-emitting element 11 along the first direction F1. Assuming the overlapping area of the two is S1, and the area of the orthographic projection of the first light-emitting element 11 along the first direction F1 is S0. It is arranged that S1/S0≥10%. As such, the first photo-sensing element D1 may accurately and effectively sense the brightness of the first light-emitting element 11.

In some further embodiments, the display panel further includes a pixel definition layer 80 disposed on a side of the array layer 90 away from the substrate 00. The pixel definition layer 80 includes pixel openings. An anode 81 of the light-emitting element 10 is located on a side of the pixel definition layer 80 facing the array layer 90. The pixel opening exposes the anode 81 of the light emitting element 10. A light-emitting layer 82 of the light-emitting element 10 is located in the pixel opening. A cathode 83 is located on a side of the light-emitting layer 82 facing away from the substrate 00. In some further embodiments, the pixel definition layer 80 also includes photo-sensing openings, when the photo-sensing element D0 is arranged in the display panel. A first and a second electrode 91 and 92 of the photo-sensing element D0 are respectively arranged on both sides of a photo-sensing layer 93. The second electrode 92 of the photo-sensing element D0 and the anode 81 of the light-emitting element 10 are arranged in the same layer. At least part of the photo-sensing layer 93 is located in the photo-sensing opening. The first electrode 91 of the photo-sensing element D0 is located on a side of the photo-sensing layer 93 facing away from the substrate 00. When the photo-sensing element D0 is used to sense the forward light emission of the light-emitting element 10, the photo-sensing layer 93 may extend directly above the light-emitting element 10. The photo-sensing layer 93 extending directly above the light-emitting element 10 and the cathode 83 are isolated by an insulating layer. The connection relationship of the photo-sensing element D0 will be explained in subsequent descriptions below.

Figure 8:
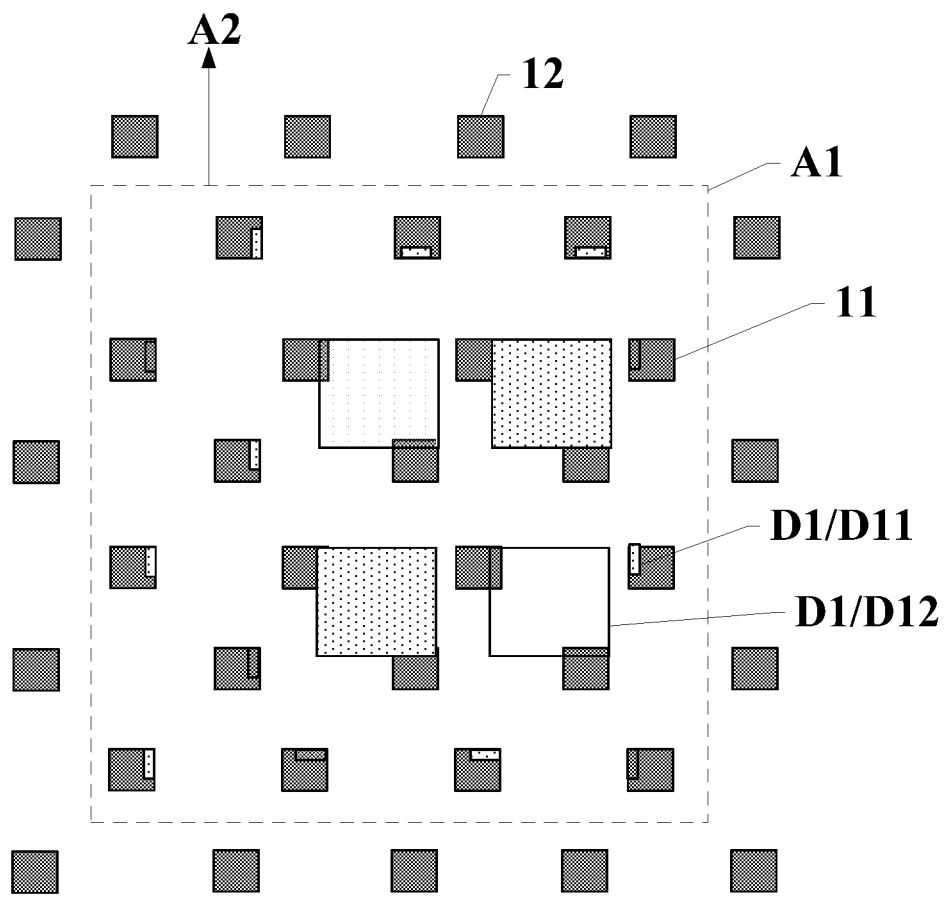
FIG. 8 shows a schematic diagram illustrating relative positions of photo-sensing elements and first light-emitting elements in a first display area according to various disclosed embodiments of the present disclosure.

FIG. 8 illustrates a schematic diagram illustrating relative positions of the photo-sensing elements and first light-emitting elements in the first display area according to the present disclosure. The first photo-sensing element D1 includes two types of sub-photo-sensing elements. The arrangement of the first light-emitting elements 11 in the first display area A1 is only illustrative and is not limited by the present disclosure.

Referring to FIG. 8, the first photo-sensing element D1 includes a first sub-photo-sensing element D11 and a second sub-photo-sensing element D12 in some cases. The first sub-photo-sensing element D11 is located on a side of the second sub-photo-sensing element D12 close to the second display area A2. The number of the first light-emitting elements 11 corresponding to the first sub-photo-sensing element D11 is smaller than the number of the first light-emitting elements 11 corresponding to the second sub-photo-sensing element D12. The number of the first light-emitting elements 11 corresponding to the first sub-photo-sensing element D11 refers to the number of the first light-emitting elements 11 overlapping with the first sub-photo-sensing element D11. The number of the first light-emitting elements 11 corresponding to the second sub-photo-sensing element D12 refers to the number of the first light-emitting elements 11 overlapping with the second sub-photo-sensing element D12.

The difference between the first and second sub-photo-sensing elements D11 and D12 is that the numbers of the first light-emitting elements 11 corresponding to the two are different. Further, the distances between the first and second sub-photo-sensing elements D11 and D12 and the second display area A2 are different. In some embodiments, the first sub-photo-sensing element D11 is closer to the second display area A2, and the second sub-photo-sensing element D12 is farther from the second display area A2. The first sub-photo-sensing element D11 that is closer to the second display area A2 corresponds to a smaller number of the first light-emitting elements 11. The smaller the number of the light-emitting elements corresponding to a photo-sensing element, the higher the accuracy of the photo-sensing element sensing the brightness of the light-emitting elements. For the first light-emitting element 11 disposed close to the second display area A2, if the brightness difference between it and the second light-emitting element 12 in the second display area A2 is large, a human eye may be able to identify the obvious difference, which affects the display effect.

In some embodiments, the first sub-photo-sensing element D11 is disposed close to the second display area A2. Since the number of the first light-emitting elements 11 corresponding to the first sub-photo-sensing element D11 is small, the brightness of the first light-emitting elements 11 close to the second display area A2 may be accurately sensed. When the luminous brightness of the first light-emitting elements 11 disposed close to the second display area A2 is lower than that of the second light-emitting elements 12 in the second display area A2, the first sub-photo-sensing element D11 senses in time and feedbacks the brightness signal to the control chip through the feedback circuit. The control chip may accurately compensate for the brightness of the first light-emitting elements 11. It is beneficial to improve the brightness compensation effect of the first light-emitting elements 11 and improve the display uniformity of the first and second display areas A1 and A2.

In some cases, when being provided for the first light-emitting element 11, the first photo-sensing element D1 is disposed in a region of the first display area A1, wherein the region is adjacent to the second display area A2 and on a side of the first light-emitting element 11 away from the second display area A2. It may be beneficial to accurately detecting the brightness of the first light-emitting element 11 adjacent to the second display area A2.

Figure 9:
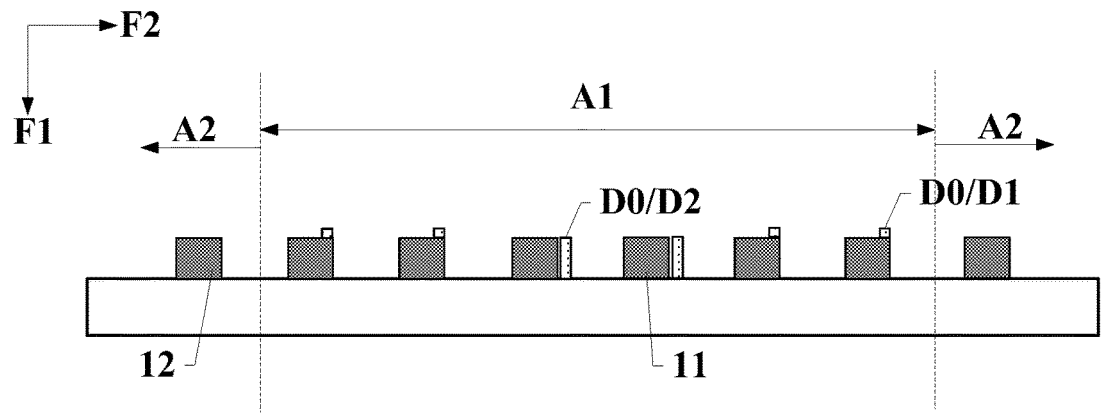
FIG. 9 shows a schematic diagram illustrating relative positions of first light-emitting elements and second photo-sensing elements in a first display area according to various disclosed embodiments of the present disclosure.
Figure 10:
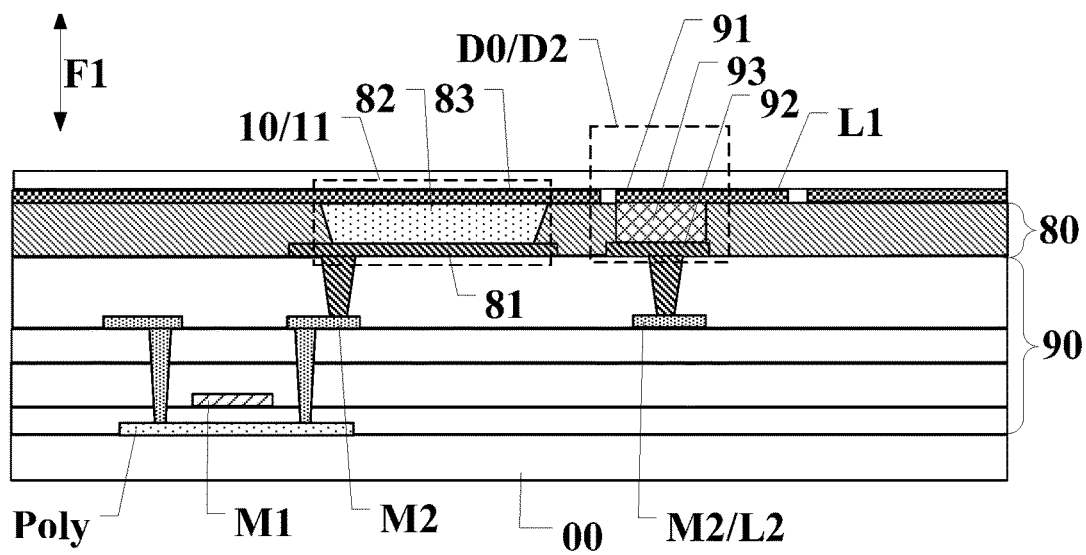
FIG. 10 shows another schematic diagram of a layer structure of a display panel according to various disclosed embodiments of the present disclosure.

FIG. 9 illustrates a schematic diagram illustrating relative positions of the first light-emitting elements 11 and second photo-sensing elements D2 in the first display area A1 according to the present disclosure. FIG. 10 illustrates another schematic diagram of a layer structure of the display panel 100 according to the present disclosure. As shown in FIG. 9, both the first and second photo-sensing elements D1 and D2 are formed in the first display area A1 in some cases. FIG. 10 depicts a relative positional diagram between the second photo-sensing element D2 and the first light-emitting element 11. For the structure of the display panel in FIG. 10, please refer to the description of that shown in FIG. 7. The difference between FIG. 10 and FIG. 7 is that the second photo-sensing element D2 and the first light-emitting element 11 in FIG. 10 do not overlap along the first direction F1, while the first photo-sensing element D1 in FIG. 7 overlaps with the first light-emitting element 11.

Referring to FIGS. 9 and 10, the photo-sensing element includes the second photo-sensing element D2. Along the first direction F1, the second photo-sensing element D2 and the first light-emitting element 11 do not overlap. Along the second direction F2, the second photo-sensing element D2 is adjacent to the first light-emitting element 11. The second direction F2 is parallel to the plane where the display panel is located. The second photo-sensing element D2 is located on a side of the first photo-sensing element D1 away from the second display area A2. The second photo-sensing element D2 being adjacent to the first light emitting element 11 indicates that no other photo-sensing elements and light emitting elements are arranged between the second photo-sensing element D2 and first light emitting element 11 along the second direction F2.

Referring to FIG. 10, the display panel also includes the pixel definition layer 80 disposed on a side of the array layer 90 away from the substrate 00 in some cases. The pixel definition layer 80 defines pixel openings. The anode 81 of the light-emitting element 10 is located on a side of the pixel definition layer 80 facing the array layer 90. The pixel opening exposes the anode 81 of the light-emitting element 10. The light-emitting layer 82 of the light-emitting element 10 is located in the pixel opening. The cathode 83 is located on a side of the light-emitting layer 82 facing away from the substrate 00. When the photo-sensing element D0 is arranged in the display panel, the pixel definition layer 80 also includes photo-sensing openings. The first and second electrodes 91 and 92 of the photo-sensing element D0 are respectively arranged on the two sides of the photo-sensing layer 93. The second electrode 92 of the photo-sensing element D0 and the anode 81 of the light-emitting element 10 are arranged in the same layer. At least part of the photo-sensing layer 93 is located in the photo-sensing opening. The first electrode 91 of the photo-sensing element D0 is located on a side of the photo-sensing layer 93 facing away from the substrate 00. Pixel openings and photo-sensing openings are provided in the pixel definition layer 80. The pixel definition layer 80 is a transparent layer. The light emitted laterally from the light-emitting layer 82 in the light-emitting element 10 is sensed by the photo-sensing layer 93 of the photo-sensing element D0. In some embodiments, the first electrode 91 of the photo-sensing element D0 is arranged in the same layer as the cathode of the light-emitting element 10. As such, there is no need to form a new layer separately for the first electrode 91 of the photo-sensing element D0. It helps simplify the layer structure of the display panel. The connection relationship of the photo-sensing element D0 will be explained in subsequent descriptions below.

FIG. 9 schematically illustrates a relative positional relationship between the first and second photo-sensing elements D1 and D2 and the first light-emitting elements 11 in the first display area A1, while the actual number and size of the first and second photo-sensing elements D1 and D2 included in the first display area A1 are not limited by FIG. 9. Moreover, FIG. 9 takes as an example that one first photo-sensing element D1 corresponds to one first light-emitting element 11 and one second photo-sensing element D2 also corresponds to one first light-emitting element 11, while the actual number of the first light-emitting elements 11 corresponding to the first and second photo-sensing elements D1 and D2 is not limited by this example.

In some embodiments, the first display area A1 is provided with the first and second photo-sensing elements D1 and D2 at the same time. In some further embodiments, the first photo-sensing element D1 refers to a photo-sensing element located directly above the first light-emitting element 11 to sense the forward light emitted by the first light-emitting element 11, and the second photo-sensing element D2 refers to a photo-sensing element located on the side of the first photo-sensing element D1 to sense the side light emitted by the first light-emitting element 11.

If the photo-sensing elements are all arranged directly above the first light-emitting element 11, they may partially block the forward light emitted by the first light-emitting element 11, even when photo-sensing elements are transparent. It may have a certain impact on the overall display brightness of the first display area A1. In order to reduce the impact on the overall brightness of the first display area A1 when the photo-sensing element is disposed directly above the first light-emitting element 11, the overlapping area of the first photo-sensing element D1 and the first light-emitting element 11 is reduced in some cases. For example, the first photo-sensing element D1 only overlaps part of the upper surface of the first light-emitting element 11 along the first direction F1. As such, the first photo-sensing element D1 may sense the forward light emitted by the first light-emitting element 11 without excessively blocking the forward light. Alternatively, the second photo-sensing element D2 is disposed in the first display area A1, and located on the side of and adjacent to the first light-emitting element 11. Then, the second photo-sensing element D2 does not block the forward light emitted by the first light-emitting element 11, reducing the output loss of the first light-emitting element 11.

Figure 11:
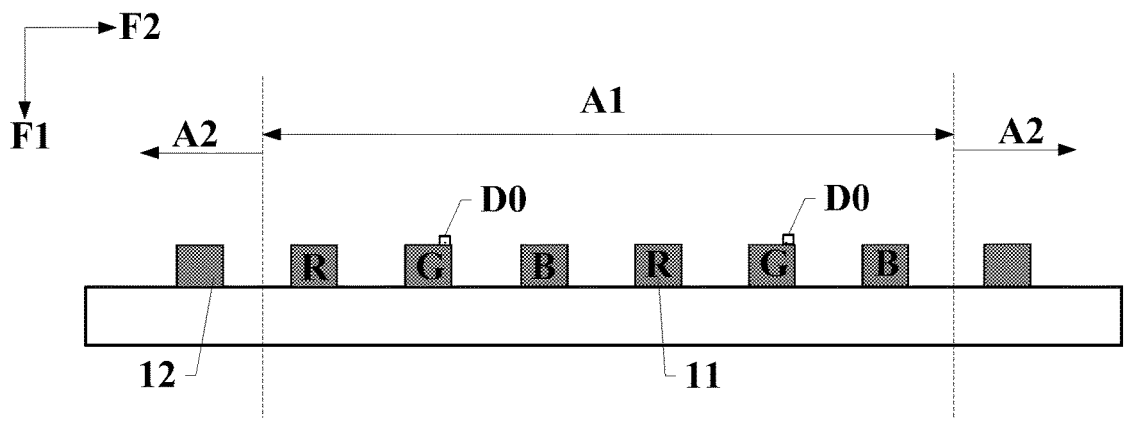
FIG. 11 shows schematic corresponding relationship between light-emitting elements of different colors and photo-sensing units in a first display area according to various disclosed embodiments of the present disclosure.

FIG. 11 illustrates schematic corresponding relationship between light-emitting elements of different colors and photo-sensing units in the first display area A1 according to the present disclosure. The figure shows relative positional relationship between photo-sensing elements and light-emitting elements, when light-emitting elements in the first display area A1 include red light-emitting elements R, green light-emitting elements G, and blue light-emitting elements B.

Referring to FIG. 11, the light-emitting elements include red light-emitting element R, green light-emitting element G, and blue light-emitting element B in some cases. The first optical detection unit 31 is used to detect the brightness of the green light-emitting element G in the first display area A1.

The embodiment shown in FIG. 11 shows an exemplary solution of arranging photo-sensing elements in the first optical detection unit 31 directly above the green light-emitting element G to sense the forward light emission of the green light-emitting element G. The relative positional relationship between the photo-sensing element D0 and the green light-emitting element is not limited by the figure. In some other embodiments, photo-sensing elements may also be arranged on the side of the green light-emitting element to sense its lateral light emission.

Under the same driving voltage/current, the brightness of the green light-emitting element G is larger, and its brightness change is more obvious. When a photo-sensing element D0 is arranged in the first display area A1 to detect the brightness of the light-emitting element, the photo-sensing element D0 is disposed directly above or on a side of the green light-emitting element G. It is conducive to achieving accurate sensing of the brightness signal, and thus is conducive to improving the brightness compensation effect of the control chip in the first display area A1. In some cases, no photo-sensing elements are provided for the red light-emitting elements and blue light-emitting elements. It is beneficial to reduce the number of photo-sensing elements in the first display area and improve the transmittance of the first display area.

Figure 12:
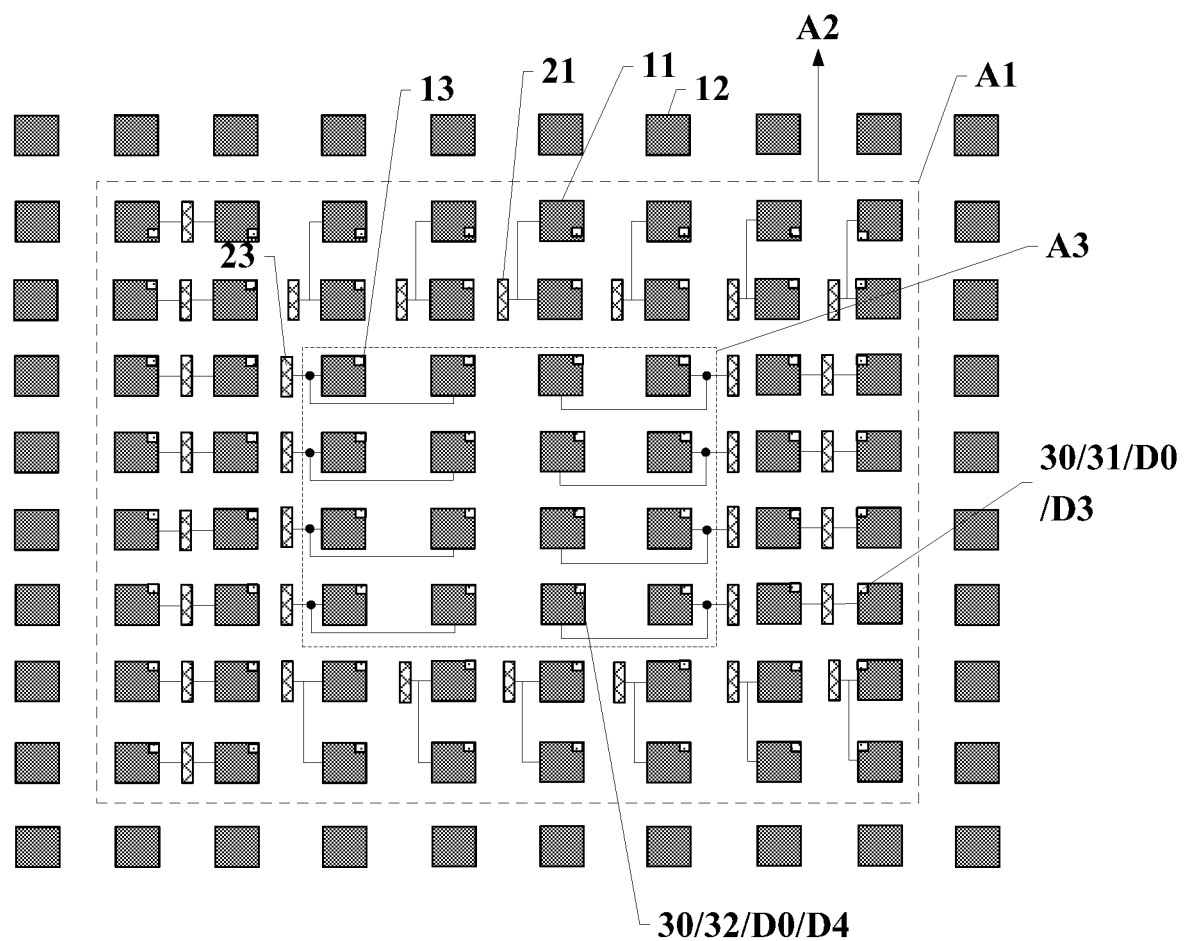
FIG. 12 shows a schematic diagram illustrating relative positional relationship of a first display area, a second display area, and a third display area in a display panel according to various disclosed embodiments of the present disclosure.

FIG. 12 illustrates a schematic diagram depicting relative positional relationship of the first display area A1, the second display area A2, and a third display area A3 in the display panel 100 according to the present disclosure. This configuration as in FIG. 12 exemplarily shows the third display area A3 with a rectangular structure and the first display area A1 with an annular structure for description, but does not limit the specific shapes of the first and third display areas A1 and A3. When the display panel includes the third display area, although not shown in FIG. 12, the second light-emitting element in the second display area may also have a corresponding second pixel circuit connected to it. For example, a second pixel circuit corresponds to a second light-emitting element. Please refer to FIG. 3 for the specific connection relationship.

In some embodiments, when the display panel does not contain the third display area A3, the first display area A1 may be surrounded by the second display area A2, as shown in FIG. 8. When the display panel includes the third display area A3, the first display area A1 may be regarded as a transition area disposed between the second and third display areas A2 and A3.

Referring to FIG. 12, the display area A0 includes the third display area A3 in some embodiments. The first display area A1 at least partially surrounds the third display area A3. The light-emitting element 10 includes a third light-emitting element 13 located in the third display area A3. The pixel circuit includes a third pixel circuit 23 connected to the third light-emitting element 13. The third pixel circuit 23 and the first pixel circuit 21 are both located in the first display area A1.

In some further embodiments, the first display area A1 is located between the second and third display areas A2 and A3. The first display area A1 may be regarded as a transition area connecting the second and third display areas A2 and A3. When the brightness difference between the first and second display areas A1 and A2 is large, it affects the overall display uniformity of the display panel. Thus, the optical detection unit 30 is arranged in the first display area A1 to detect the brightness of the first light-emitting element 11 in the first display area A1. The third display area A3 is regarded as a photo-sensing area, so it has higher requirement for optical transmittance. When the third pixel circuit 23 connected to the third light-emitting element 13 in the third display area A3 is arranged in the first display area A1, the third pixel circuit 23 is not provided in the third display area A3. Therefore, the impact on the transmittance of the third display area A3 when the third pixel circuit 23 is arranged in the third display area A3 is avoided. It is conducive to improving the transmittance of the third display area A3, and thus conducive to improving the photo-sensing effect of the third display area A3 in the photo-sensing stage.

Referring to FIG. 12, the optical detection unit 30 also includes a second optical detection unit 32 located in the third display area A3 in some cases. The second optical detection unit 32 is used to detect the brightness of the third light-emitting element 13 in the third display area A3.

In some cases, when the display panel includes the third display area A3, the second optical detection unit 32 is arranged in the third display area A3 to detect the brightness of the third light-emitting element 13 in the third display area A3. When the difference in luminous brightness between the third and second display areas A3 and A2 is detected, the luminous brightness of the third light-emitting element 13 in the third display area A3 may be compensated according to the detection result of the third optical detection unit 30. It is beneficial to improving the overall display brightness uniformity of the first, second, and third display areas A1, A2, and A3.

The configuration shown in FIG. 12 schematically shows that along the first direction, the photo-sensing element in the first display area overlaps the first light-emitting element 11, and the photo-sensing element D0 in the third display area A3 overlaps the third light-emitting element 13. However, the relative positional relationship between the photo-sensing element D0 and the light-emitting element 10 in the first and third display areas A1 and A3 is not limited by the figure. The relative positional relationship between the photo-sensing elements and the light-emitting elements in the first and third display areas A1 and A3 may also be reflected in other forms, such as embodiments shown in FIGS. 13 and 14.

Figure 13:
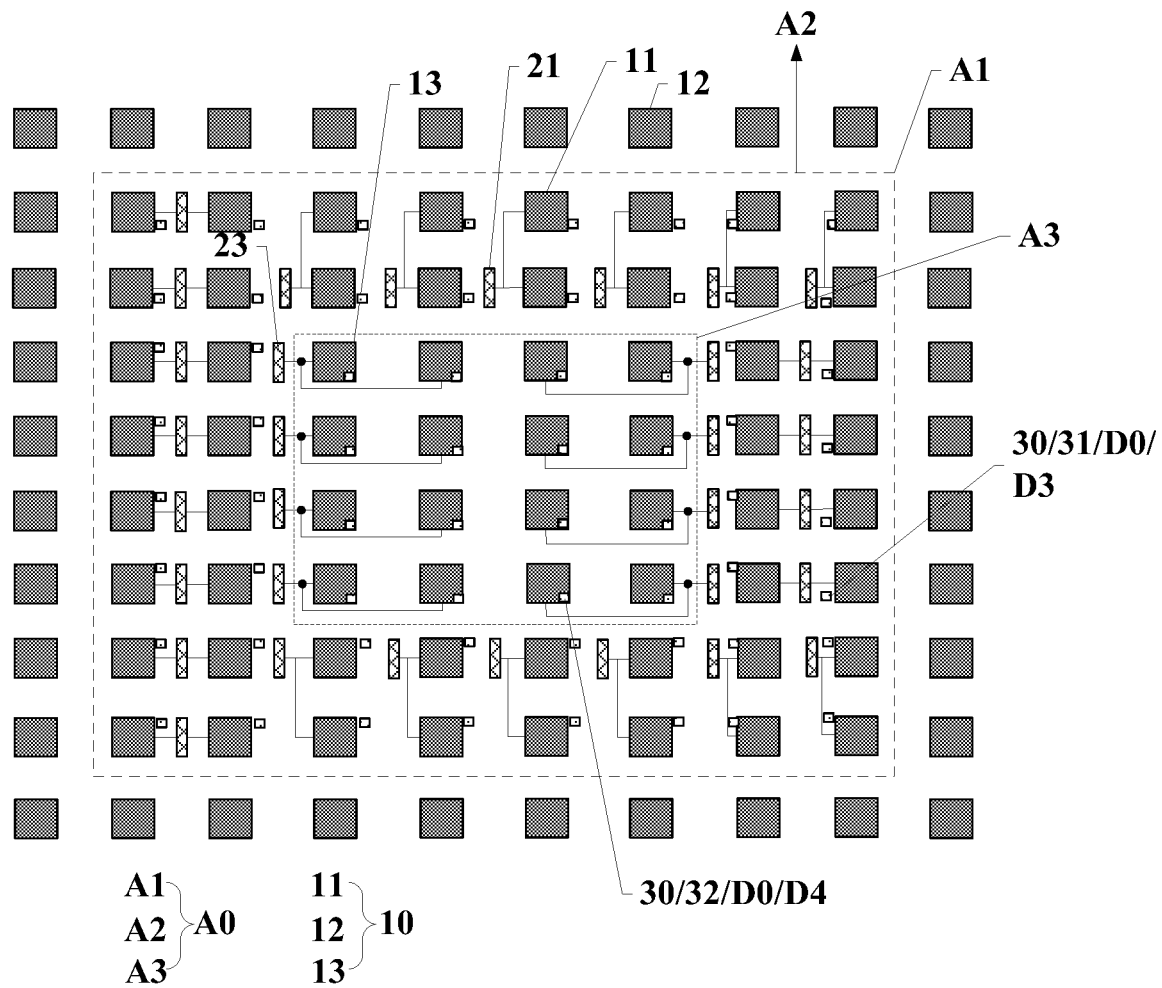
FIG. 13 shows another schematic diagram illustrating relative positional relationship of a first display area, a second display area, and a third display area in a display panel according to various disclosed embodiments of the present disclosure.
Figure 14:
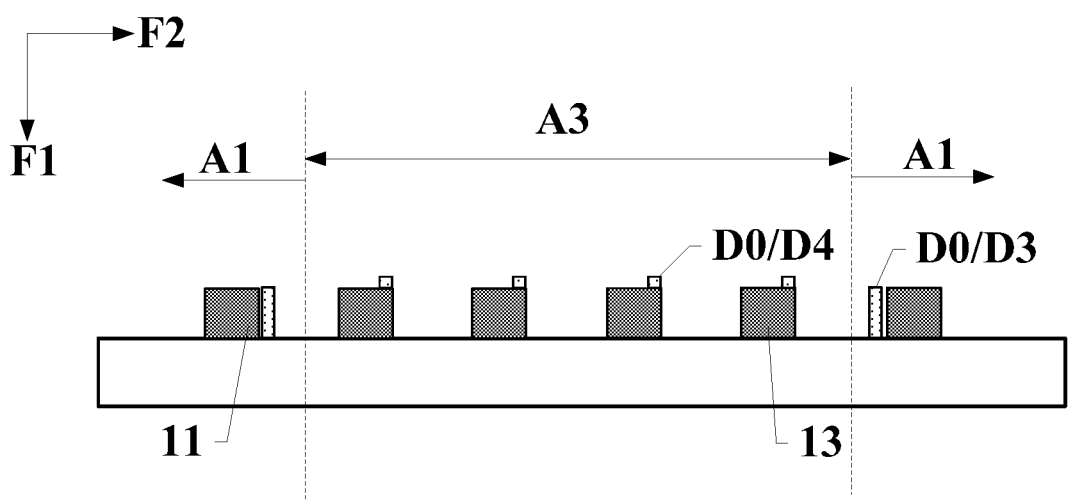
FIG. 14 shows a schematic diagram illustrating relative positional relationship of a third photo-sensing element, a fourth photo-sensing element, a third light-emitting element, and a first light-emitting element of FIG. 13 according to various disclosed embodiments of the present disclosure.

FIG. 13 illustrates another schematic diagram showing relative positional relationship of the first, second, and third display areas A1, A2, and A3 in the display panel 100 according to the present disclosure. FIG. 14 illustrates a schematic diagram illustrating relative positional relationship of third photo-sensing elements D3, fourth photo-sensing elements D4, third light-emitting elements 13, and first light-emitting elements 11 of FIG. 13 according to the present disclosure. Referring to FIGS. 13 and 14, the first optical detection unit 31 includes a third photo-sensing element D3, and the second optical detection unit 32 includes a fourth photo-sensing element D4. Along the first direction F1, the third photo-sensing element D3 and the first light-emitting element 11 do not overlap. Along the second direction F2, the third photo-sensing element D3 is adjacent to the first light-emitting element 11. Along the first direction F1, at least a fourth photo-sensing element D4 overlaps the third light-emitting element 13. As aforementioned, the first direction F1 is perpendicular to the plane where the display panel is located, and the second direction F2 is parallel to the plane where the display panel is located. When the display panel includes the third display area, although not shown in FIG. 13, the second light-emitting element in the second display area may also have a corresponding second pixel circuit connected to it. For example, a second pixel circuit corresponds to a second light-emitting element, and FIG. 3 shows exemplary the connection relationship.

Referring to FIGS. 13 and 14, the third photo-sensing elements D3 are arranged in the first display area A1 to detect the brightness of the first light-emitting elements 11 in the first display area A1. The fourth photo-sensing elements D4 are arranged to detect the brightness of the third light-emitting elements 13 in the third display area A3. Further, the relative positions of the third and fourth photo-sensing elements D3 and D4 and the light-emitting element are designed differently. The third photo-sensing element D3 is disposed on a side of the first light-emitting element 11. It may reduce the influence of the third photo-sensing element D3 on the forward light emission of the first light-emitting element 11, make the brightness of the first display area A1 closer to that of the second display area A2 after brightness compensation, and achieve a smooth transition in brightness between the second and third display areas A2 and A3. In addition, since the third display area A3 performs the photo-sensing function at the photo-sensing stage (such as shooting), the third display area A3 is regarded as a light-transmitting area. When the fourth photo-sensing element D4 is disposed above the third light-emitting element 13, it is helpful to reduce the optical diffraction problem in the light-transmitting area. Thus, it is helpful to improve the photo-sensing effect of the light-transmitting area. In some embodiments, with respect to the third photo-sensing element D3 and the first light-emitting element 11 adjacent to the second display area A2, when being disposed on a side of the first light-emitting element 11, the third photo-sensing element D3 is disposed on a side of the first light-emitting element 11 away from the second display area A2. This is beneficial to avoid the impact of the luminous brightness of the light-emitting elements in the second display area A2 adjacent to the third photo-sensing element D3 on the light sensed by the third photo-sensing element D3. It is conducive to the third photo-sensing element D3 accurately detecting the display brightness of the first light-emitting element 11 in the first display area A1.

Figure 15:
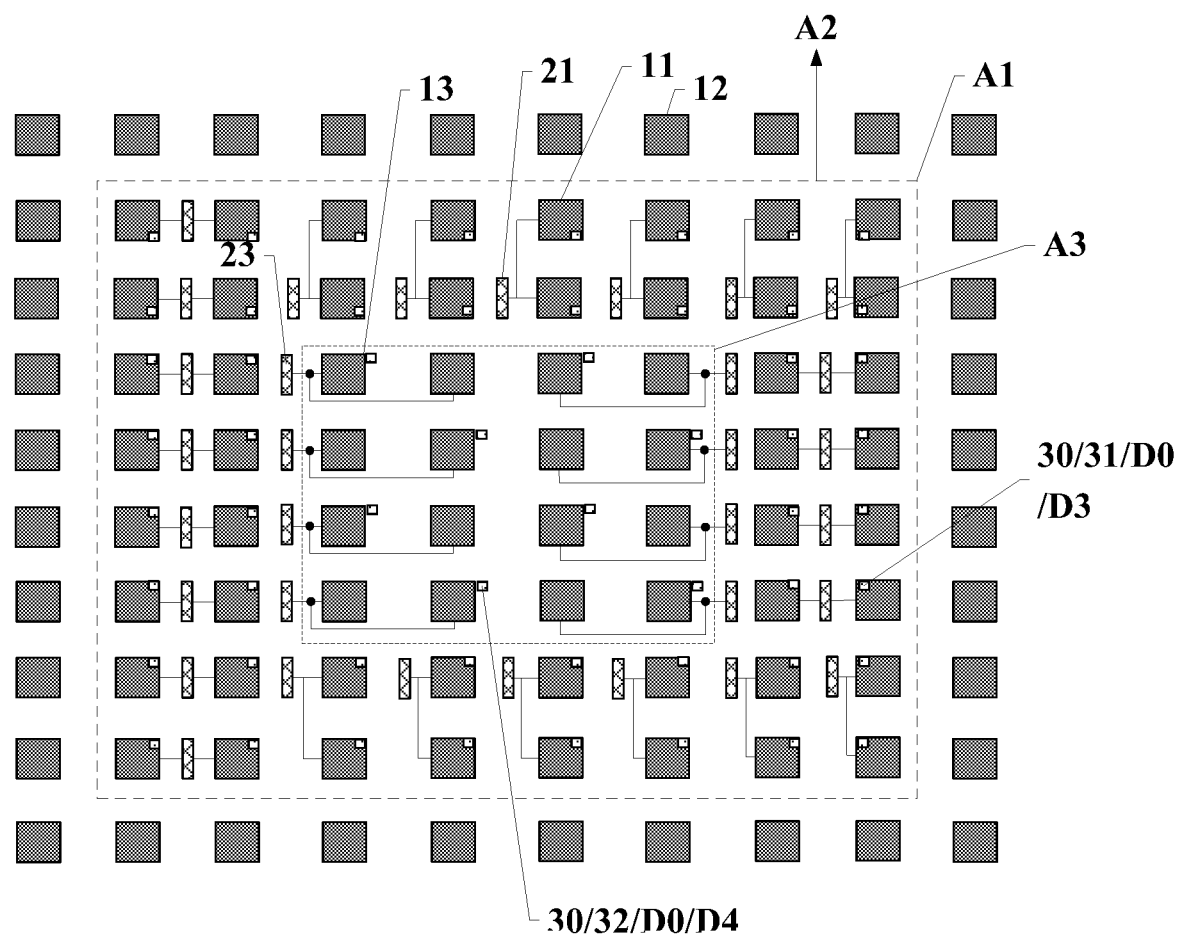
FIG. 15 shows another schematic diagram illustrating relative positional relationship of a first display area, a second display area, and a third display area in a display panel according to various disclosed embodiments of the present disclosure.

FIG. 15 illustrates another schematic diagram illustrating relative positional relationship of the first, second, and third display areas A1, A2, and A3 in the display panel 100 according to the present disclosure. In some embodiments, the first optical detection unit 31 includes the third photo-sensing element D3, and the second optical detection unit 32 includes the fourth photo-sensing element D4. The arrangement density of the third photo-sensing elements D3 is greater than that of the fourth photo-sensing elements D4. The arrangement densities of the photo-sensing elements in the first and third display areas A1 and A3 are differently designed. The arrangement density may refer to the number of photo-sensing elements arranged in a unit area, or the area ratio of photo-sensing elements in a unit area. Since the third display area A3 plays a photo-sensing function at the photo-sensing stage, the third display area A3 has a high requirement for optical transmittance. When the fourth photo-sensing element D4 is arranged in the third display area A3, the arrangement density of the fourth photo-sensing element D4 is smaller than that of the third photo-sensing element D3 in the first display area A1. Thus, it is beneficial to reduce the area occupied by the fourth photo-sensing element D4 in the third display area A3, and reduce the impact of the arrangement of the fourth photo-sensing element D4 on the transmittance of the third display area A3.

Figure 16:
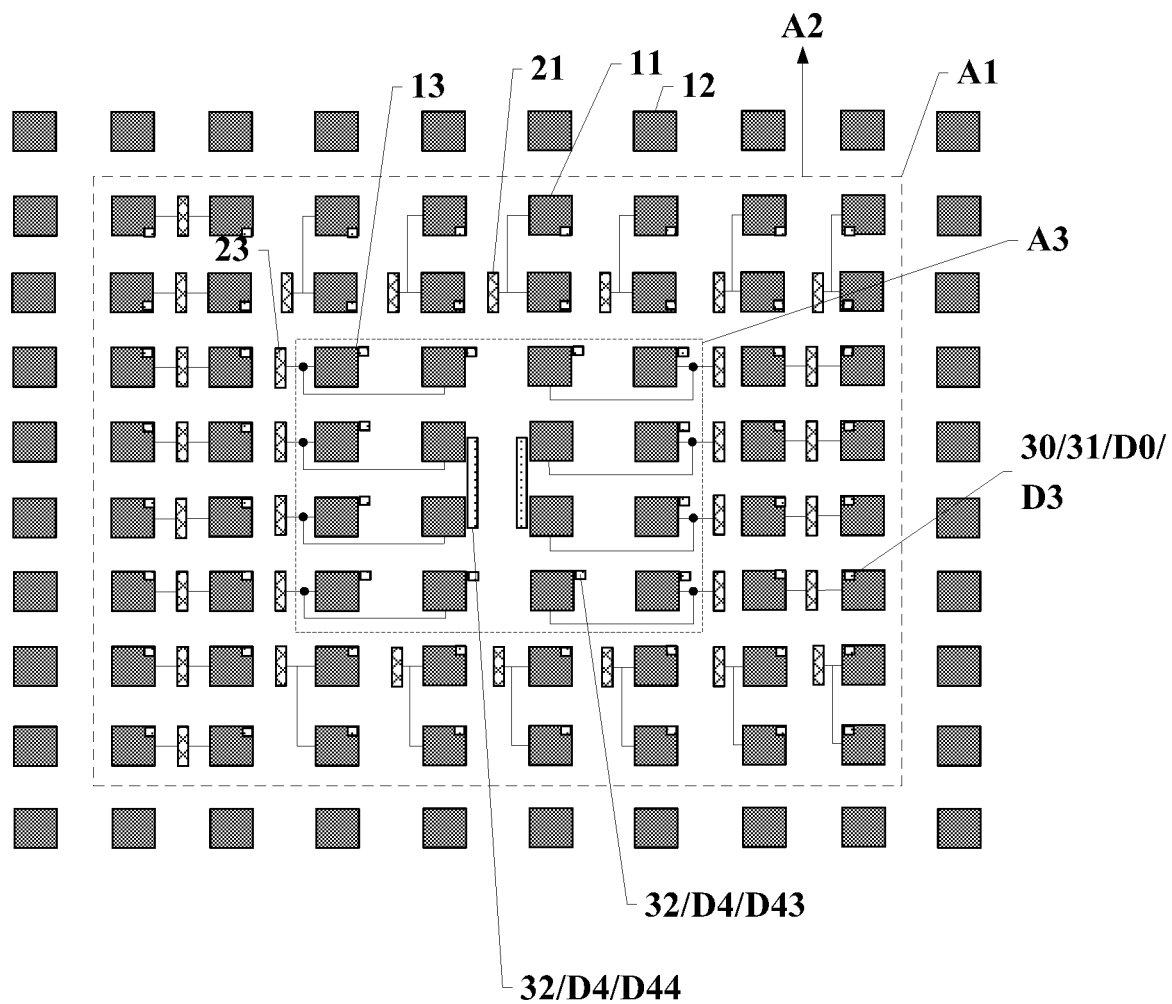
FIG. 16 shows a schematic diagram illustrating relative positions of third sub-photo-sensing elements, fourth sub-photo-sensing elements, and light-emitting elements in a third display area according to various disclosed embodiments of the present disclosure.

FIG. 16 illustrates a schematic diagram illustrating relative positions of third sub-photo-sensing elements D43, fourth sub-photo-sensing elements D44, and light-emitting elements in the third display area A3 according to the present disclosure. Referring to FIG. 16, the second optical detection unit 32 includes a fourth photo-sensing element D4 that is used to sense the brightness of the third light-emitting element 13. The fourth photo-sensing element D4 includes the third sub-photo-sensing element D43 and fourth sub-photo-sensing element D44. The third sub-photo-sensing element D43 is located on a side of the fourth sub-photo-sensing element D44 close to the first display area A1. The number of the third light-emitting elements 13 corresponding to a third sub-photo-sensing element D43 is smaller than that corresponding to the fourth sub-photo-sensing element D44. For example, while a third sub-photo-sensing element D43 corresponds to one third light-emitting element 13, a fourth sub-photo-sensing element D44 exemplarily corresponds to two third light-emitting elements 13.

In some embodiments, the difference between the third and fourth sub-photo-sensing elements D43 and D44 lies in the number of corresponding third light-emitting elements 13. Additionally, the distances between the third and fourth sub-photo-sensing elements D43 and D44 and the first display area A1 are different. The third sub-photo-sensing element D43 is closer to the first display area A1, while the fourth sub-photo-sensing element D44 is farther from the first display area A1. The third sub-photo-sensing element D43 that is closer to the first display area A1 corresponds to a smaller number of the third light-emitting elements 13. The fewer the number of light-emitting elements corresponding to a photo-sensing element, the higher the accuracy of the photo-sensing element sensing the brightness of the light-emitting elements. For the third light-emitting element 13 disposed close to the first display area A1, if the brightness difference between it and the second light-emitting element 12 in the first display area A1 is large, the human eye may be able to recognize the obvious difference, which may affect the display effect.

In some embodiments, the third sub-photo-sensing element D43 is arranged close to the first display area A1. Since the number of the third light-emitting elements 13 corresponding to the third sub-photo-sensing element D43 is small, the brightness of the third light-emitting elements 13 close to the first display area A1 may be accurately sensed. When the luminous brightness of the third light-emitting element 13 disposed close to the first display area A1 is lower than that of the third light-emitting element 13 in the first display area A1, the third sub-photo-sensing element D43 may be able to sense in time and feedback a brightness signal to a control chip through the feedback circuit, and then the control chip may be able to accurately compensate for the brightness of the third light-emitting element 13. It may improve the brightness compensation effect of the third light-emitting element 13 and the display uniformity of the first and third display areas A1 and A3.

Referring to FIGS. 6 and 5, the optical detection unit 30 includes the photo-sensing element D0 and the feedback circuit connected to the photo-sensing element. The feedback circuit includes the control signal line L1 and detection signal line L2. The input terminal of the control signal line L1 is electrically connected to the enable signal terminal (Vn, Vn+1, Vn+2, etc.). The output end of the control signal line L1 is electrically connected to the input end of the photo-sensing element D0. The output end of the photo-sensing element D0 is connected to the control chip IC through the detection signal line L2.

In some embodiments, the feedback circuit in the optical detection unit 30 includes the control signal line L1 and detection signal line L2. The input end of the photo-sensing element D0 is connected to the control signal line L1. The output end of the photo-sensing element D0 is connected to the detection signal line L2. Thus, the signal from the enable signal terminal (Vn, Vn+1, Vn+2, etc.) is transmitted to the photo-sensing element D0 through the control signal line L1. When the photo-sensing element D0 receives the enable signal and is turned on, it senses the brightness of corresponding light-emitting elements. The sensed brightness signal is transmitted to the control chip IC through the detection signal line L2. The control chip IC compensates the brightness of the light-emitting elements according to the brightness signal, improving the uniformity of display brightness in different display areas of the display panel. The feedback circuit is only provided with the control signal line L1 and detection signal line L2, while other components are not arranged. Thus, it is helpful to reduce the area occupied by the feedback circuit in the display area and meet the high PPI requirements of the display panel.

Figure 17:
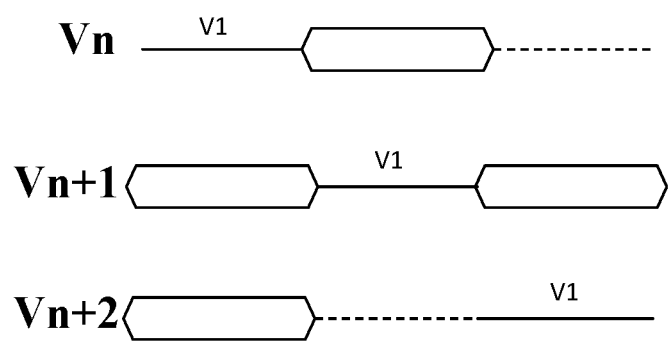
FIG. 17 shows a schematic driving timing diagram of a feedback circuit according to various disclosed embodiments of the present disclosure.

FIG. 17 illustrates a schematic driving timing diagram of the feedback circuit according to the present disclosure. Vn, Vn+1 and Vn+2 are respectively signals of the enable signal terminals connected to the control signal lines L1 corresponding to the photo-sensing elements of the nth row, (n+1)th row and (n+2)th row, which makes a signal at an enable signal terminal a DC signal V1 or a high-impedance signal. When it is the DC signal V1, a corresponding photo-sensing element is turned on and performs the function of brightness detection. When it is the high-impedance signal, the corresponding photo-sensing element is turned off. The DC signal V1 may be a ground signal, or a constant positive or negative voltage signal. In some embodiments, the photo-sensing elements are used to detect the brightness of the light-emitting elements line by line.

Referring to FIG. 6, the control signal lines L1 extend along the second direction F2 and are arranged along the third direction F3, and the detection signal lines L2 extend along the third direction F3 and are arranged along the second direction F2. The second direction F2 and third direction F3 intersect. Photo-sensing elements D0 located in the same row along the second direction F2 are electrically connected to the same control signal line L1. Photo-sensing elements D0 located in the same column along the third direction F3 are electrically connected to the same detection signal line L2.

With regard to the trace method of the feedback circuit, the input ends of the photo-sensing elements D0 located in the same row along the second direction F2 are connected to the same control signal line L1. Photo-sensing elements D0 in different rows are connected to different control signal lines L1. In this way, the number of the control signal lines L1 included in the display panel may be effectively reduced, and the area ratio of the control signal lines L1 in the display panel may be reduced. It is conducive to improving the PPI of display panels. In addition, the output ends of the photo-sensing elements D0 located in the same column along the third direction F3 are connected to the same detection signal line L2. There is no need to introduce different detection signal lines L2 for different photo-sensing elements D0. It is beneficial to reduce the number of detection signal lines L2 in the display panel, reduce the area ratio of the detection signal line L2 in the display panel, and improve the PPI of the display panel.

Figure 18:
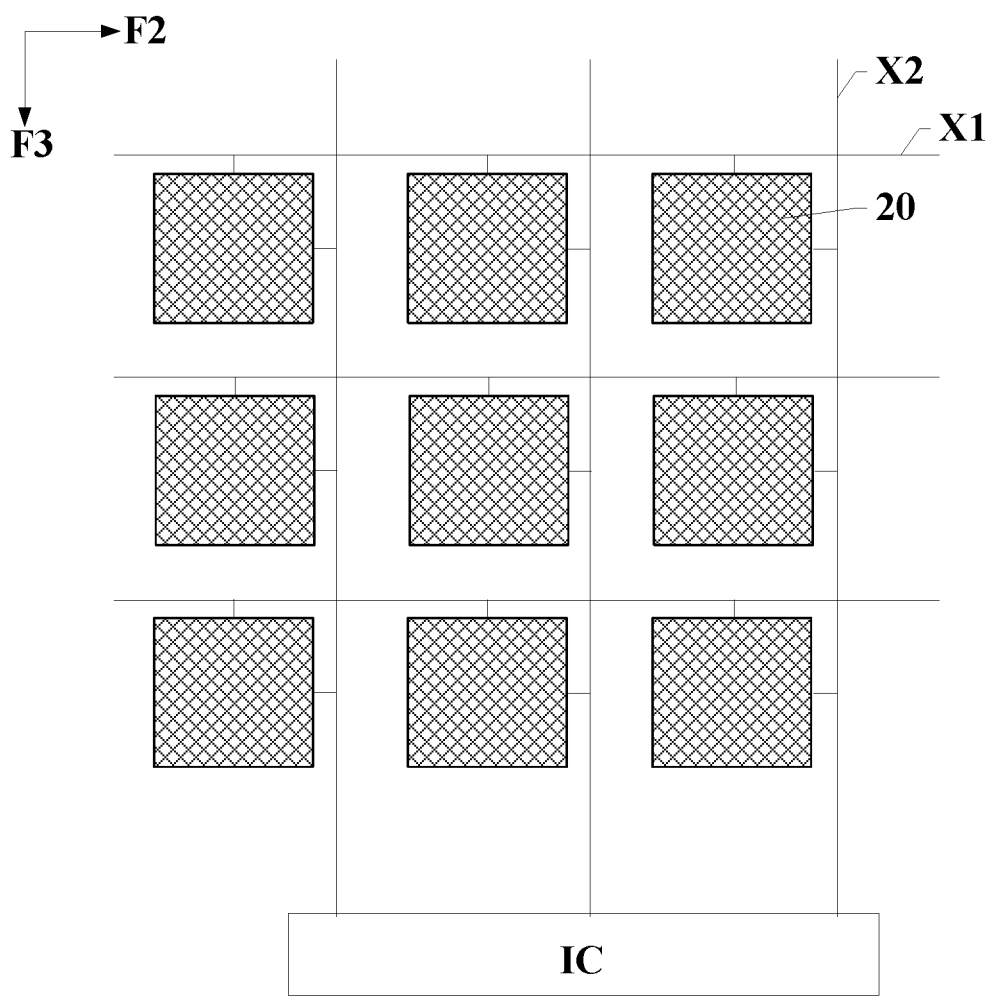
FIG. 18 shows a schematic diagram of connections between pixel circuits and first and second fixed potential signal lines in a display panel according to various disclosed embodiments of the present disclosure.

FIG. 18 illustrates a schematic diagram of connections between the pixel circuits 20 and the first and second fixed potential signal lines X1 and X2 in the display panel 100 according to the present disclosure. FIG. 18 exemplarily shows the connection relationship between the pixel circuits 20 and the signal lines X1 and X2, while other signal lines connected to the pixel circuit 20 are omitted. For example, the pixel circuit 20 may also be connected to some other signal lines. In some embodiments, the first fixed potential signal line X1 may be, for example, a first reset signal line Vref1 (or a second reset signal line Vref2) that provides a reset signal for the pixel circuit in FIG. 4. The first fixed potential signal line X1 may also be other signal lines that provide constant potential signals to the pixel circuit 20 and extend along the second direction F2. The second fixed potential signal line X2 may be, for example, a power signal line PVDD that provides power signals for the pixel circuit in FIG. 4, or other signal lines that provide constant potential signals to the pixel circuit 20 and extend along the third direction F3. Signals transmitted via these signal lines are constant. In some cases, the pixel circuit 20 may adopt certain pixel circuits, such as 7T1C (containing seven transistors and a capacitor) circuit, 8T1C (containing eight transistors and a capacitor) circuit, etc.

Figure 19:
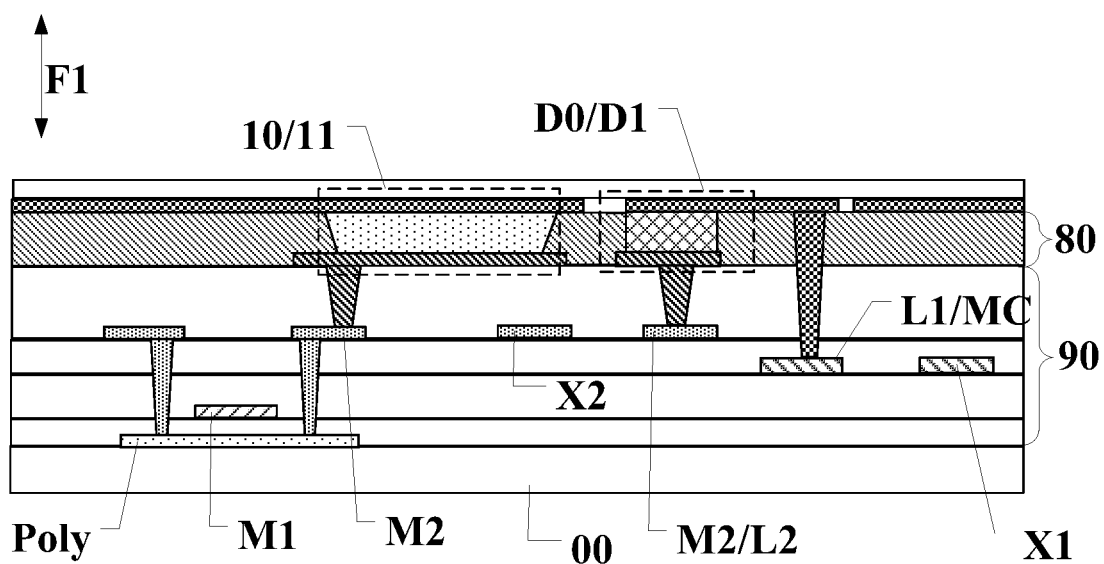
FIG. 19 shows another schematic diagram of a layer structure of a display panel according to various disclosed embodiments of the present disclosure.

FIG. 19 illustrates another schematic diagram of a layer structure of the display panel 100 according to the present disclosure, and shows the relative positional relationship among the control signal line, detection signal line, and first and second fixed potential signal lines. Referring to FIGS. 18 and 19, the display panel includes the first and second fixed potential signal lines X1 and X2 electrically connected to the pixel circuit 20. The first fixed potential signal line X1 extends along the second direction F2, and the second fixed potential signal line X2 extends along the third direction F3. The control signal line L1 and first fixed potential signal line X1 are in the same layer and arranged adjacently. The detection signal line L2 and second fixed potential signal line X2 are in the same layer and arranged adjacently.

The display panel includes the feedback circuit. In some embodiments, the display panel also includes the control signal line L1 and the detection signal line L2. Since signals are transmitted via both the control signal line L1 and detection signal line L2, in order to reduce or avoid the influence of the signals from the control signal line L1 and detection signal line L2 on the signals on the original signal lines in the display panel, the control signal line L1, detection signal line L2, and original fixed potential signal lines in the display panel are arranged in the same layer in some further embodiments. For example, the control signal line L1 extending along the second direction F2 is placed in the same layer as the first fixed potential signal line X1 extending along the second direction F2 in the display panel. The detection signal line L2 extending along the third direction F3 is placed in the same layer as the second fixed potential signal line X2 extending along the third direction F3 in the display panel. This helps reduce the impact of the feedback circuit on signals of the pixel circuit. In addition, when the control signal line L1 and the detection signal line L2 in the feedback circuit are placed in the same layer as the fixed potential signal lines in the display panel, there is no need to add a new layer to the display panel to set up the control signal line L1 and detection signal line L2. Therefore, it is also helpful to simplify the overall layer structure of the display panel when introducing the feedback circuit, and realize the thinning requirement of the display panel.

When the control signal lines and detection signal lines are made using the existing layer structure of the display panel, traces connected to the control signal lines or detection signal lines may be formed in the display panel when the corresponding layer structure is fabricated. The control signal lines and detection signal lines are electrically connected to the control chip through various designs of traces. Referring to FIGS. 7 and 19, in some cases, the control signal line L1 and first fixed potential signal line X1 are located in a capacitive metal layer MC, and the detection signal line L2 and second fixed potential signal line X2 are located in the second metal layer M2 of the display panel.

FIGS. 7 and 19 schematically illustrate layer positions of the control signal line L1 and detection signal line L2.

Alternatively, the control signal line L1 and detection signal line L2 may be arranged in other layers of the display panel.

Figure 20:
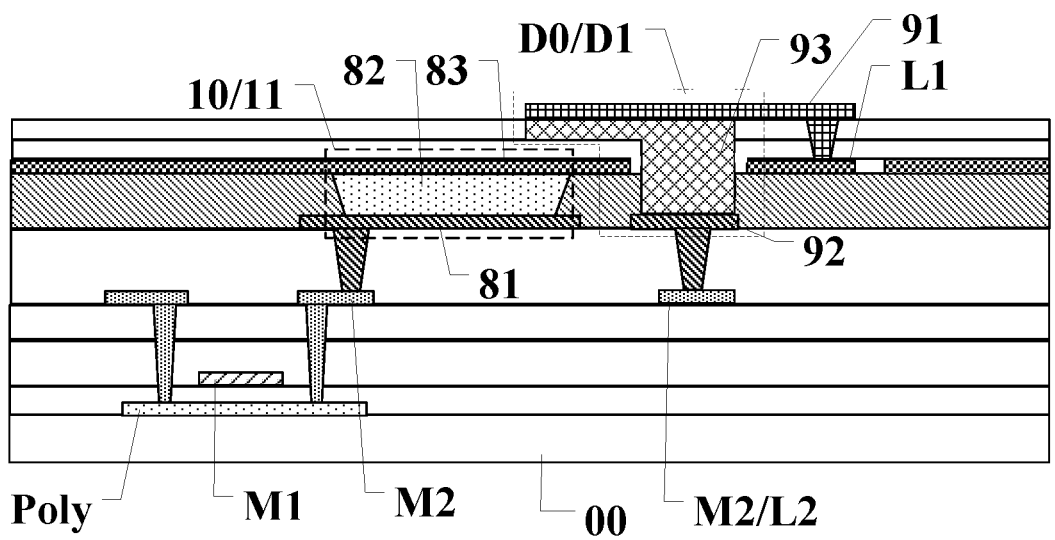
FIG. 20 shows another schematic diagram of a layer structure of a display panel according to various disclosed embodiments of the present disclosure.

FIG. 20 illustrates another schematic diagram of a layer structure of the display panel 100 according to the present disclosure. As shown in FIGS. 20 and 9, the control signal line L1 is arranged in the same layer as the layer where the cathode 83 is located in the display panel, but is insulated from cathode 83. Thus, the control signal line L1 may be routed in the layer where the cathode 83 is located. When the photo-sensing element D0 is arranged in the display panel, the layer where the cathode of the display panel is located is patterned to avoid the photo-sensing element D0. The control signal line L1 is set in the layer where the patterned cathode is located to simplify the layer structure of the display panel.

In some embodiments, when the detection signal line L2 is arranged in the same layer as some traces of the pixel circuit, the detection signal line L2 is disposed between two adjacent pixel circuits along the second direction. When the control signal line L1 is placed in the same layer as some traces of the pixel circuit, the control signal line L1 is disposed between adjacent pixel circuits along the third direction F3.

Figure 21:
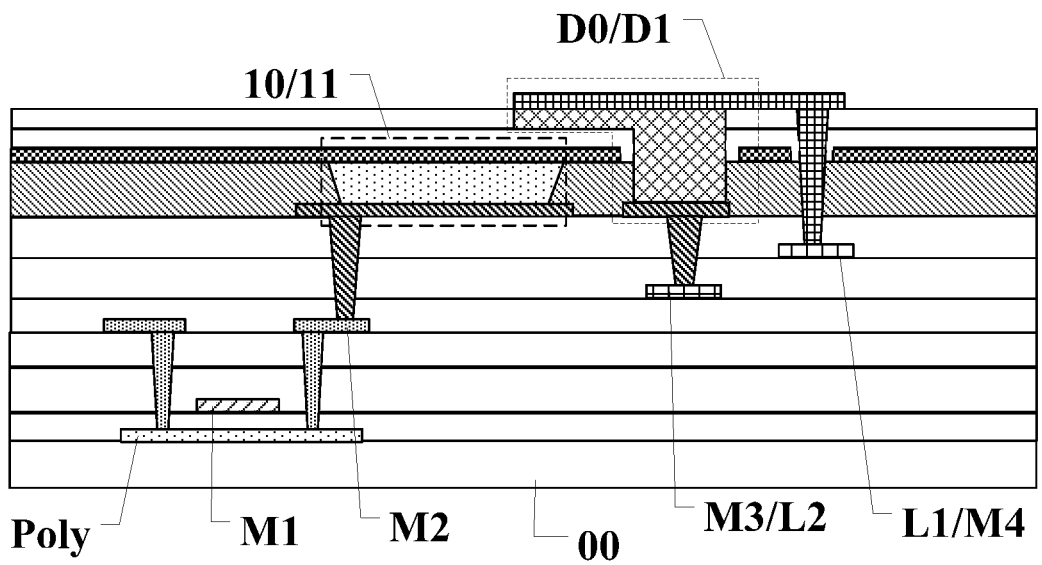
FIG. 21 shows another schematic diagram of a layer structure of a display panel according to various disclosed embodiments of the present disclosure.

FIG. 21 illustrates another schematic diagram of a layer structure of the display panel 100 according to the present disclosure. In some embodiments, the display panel includes signal traces electrically connected to the pixel circuits. The control signal line L1 and detection signal line L2 are arranged in different layers from the signal traces.

Assuming the display panel includes two or more metal layers to provide signal traces electrically connected to the pixel circuits. When the feedback circuit is arranged in the display panel, a new metal layer is added to the display panel to set up the control signal line L1 and detection signal line L2 in the feedback circuit. For example, in FIG. 21, the display panel also includes a third metal layer M3 and a fourth metal layer M4. The signal traces connected to the pixel circuits in the display panel are located in the first and second metal layers M1 and M2. The control signal line L1 and detection signal line L2 in the feedback circuit corresponding to the photo-sensing elements are respectively provided in the fourth and third metal layers M4 and M3. It may increase the distance between the control and detection signal lines L1 and L2 and the original signal lines in the display panel, reduce or avoid the impact of signals in the feedback circuit on signals in the pixel circuit, and ensure the display reliability of the display panel. FIG. 21 exemplarily shows that the control signal line L1 is in the fourth metal layer M4, and the detection signal line L2 is in the third metal layer M3. Alternatively, the control signal line L1 may also be located in the third metal layer M3, and the detection signal line L2 may be located in the fourth metal layer M4.

In some embodiments, when the control signal line and detection signal line are made using a newly added layer, connection traces may be formed in the newly added film layer to realize the electrical connection between the control and detection signal lines and the control chip.

Figure 22:
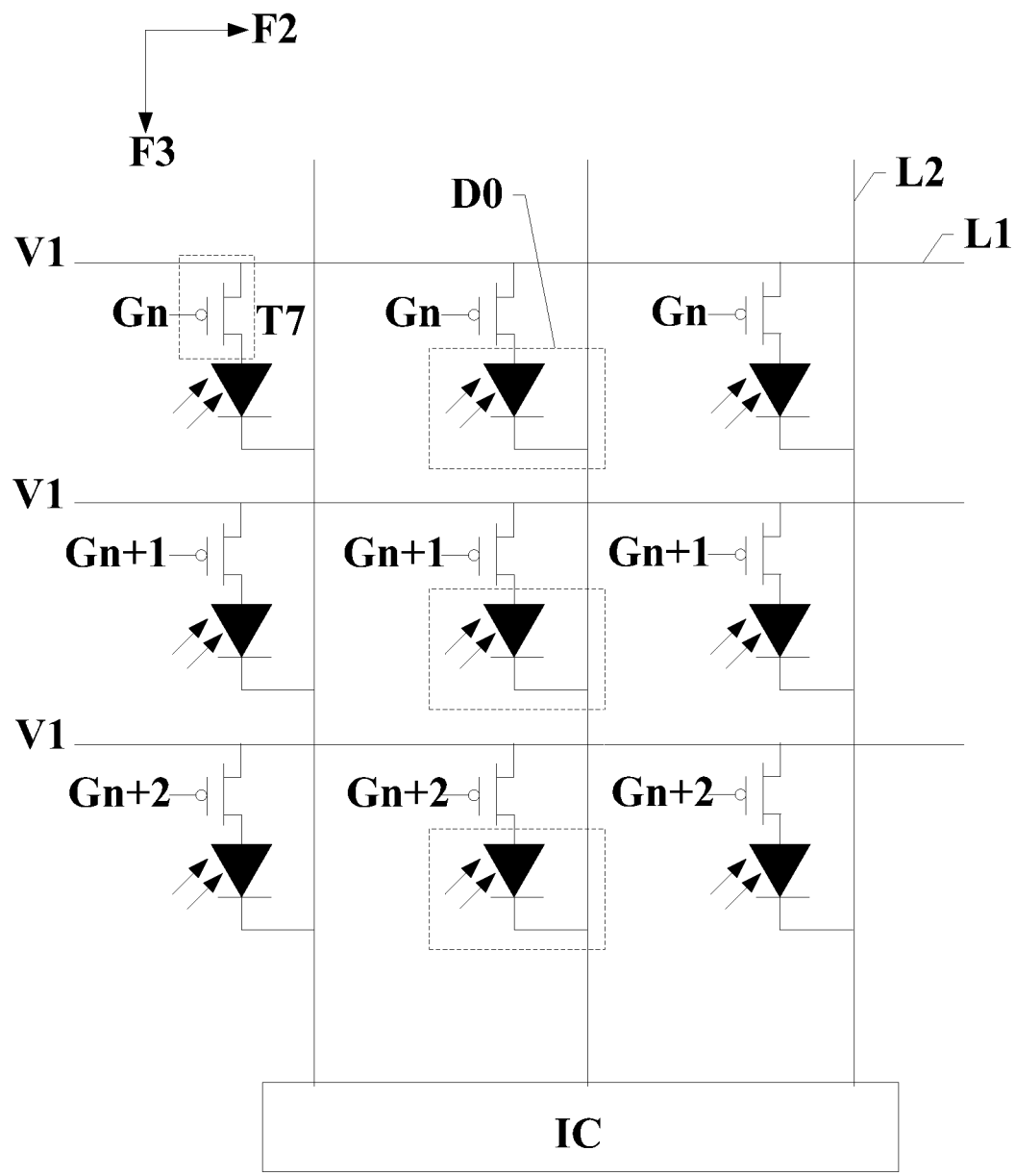
FIG. 22 shows another schematic diagram of connections between photo-sensing elements and feedback circuits according to various disclosed embodiments of the present disclosure.
Figure 23:
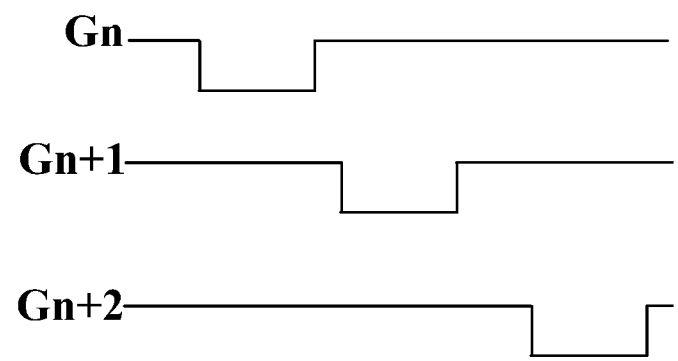
FIG. 23 shows a schematic voltage timing diagram of an on-signal control terminal according to various disclosed embodiments of the present disclosure.
Figure 24:
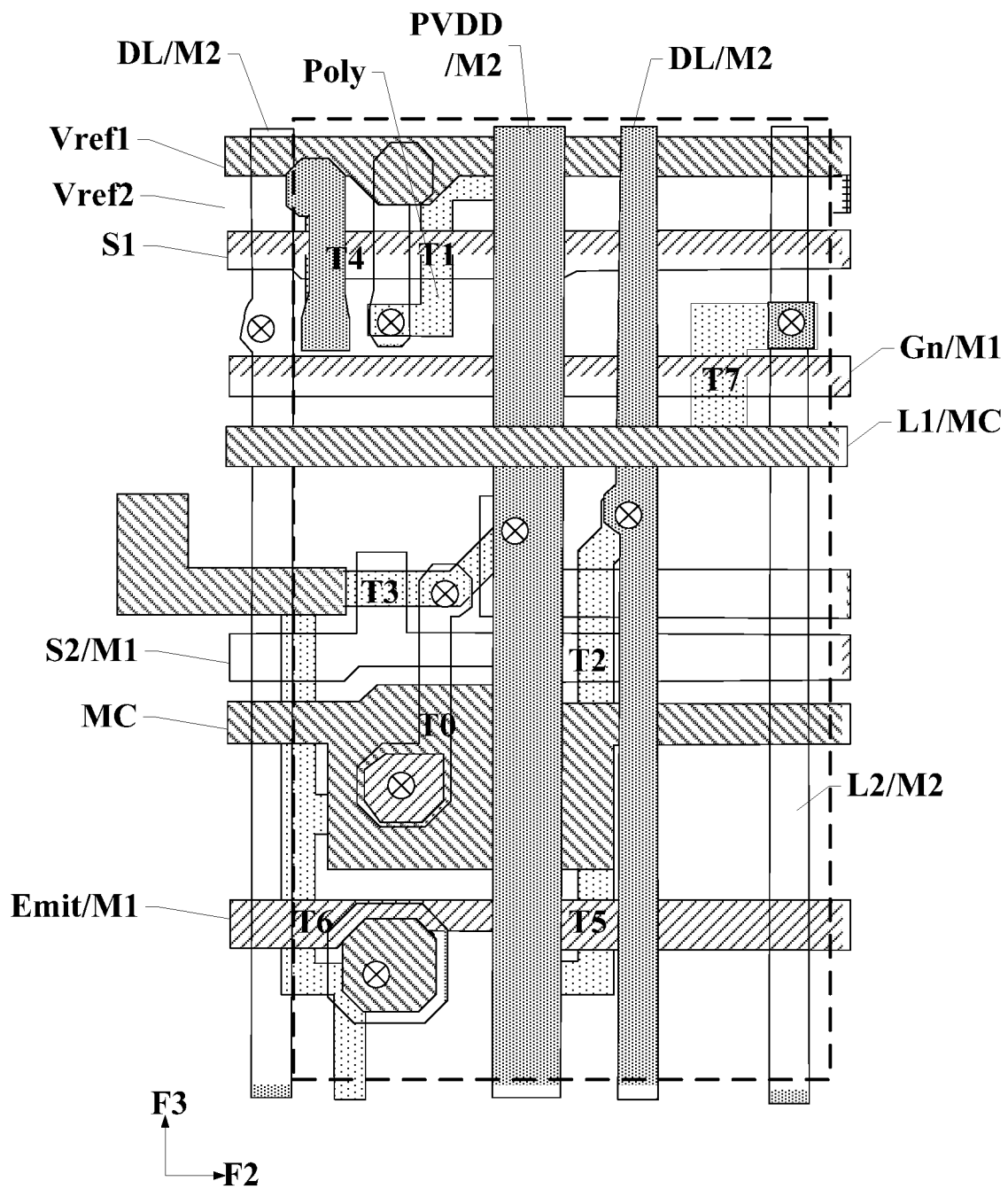
FIG. 24 shows a schematic layout diagram of pixel circuits and signal lines in optical detection units according to various disclosed embodiments of the present disclosure.
Figure 25:
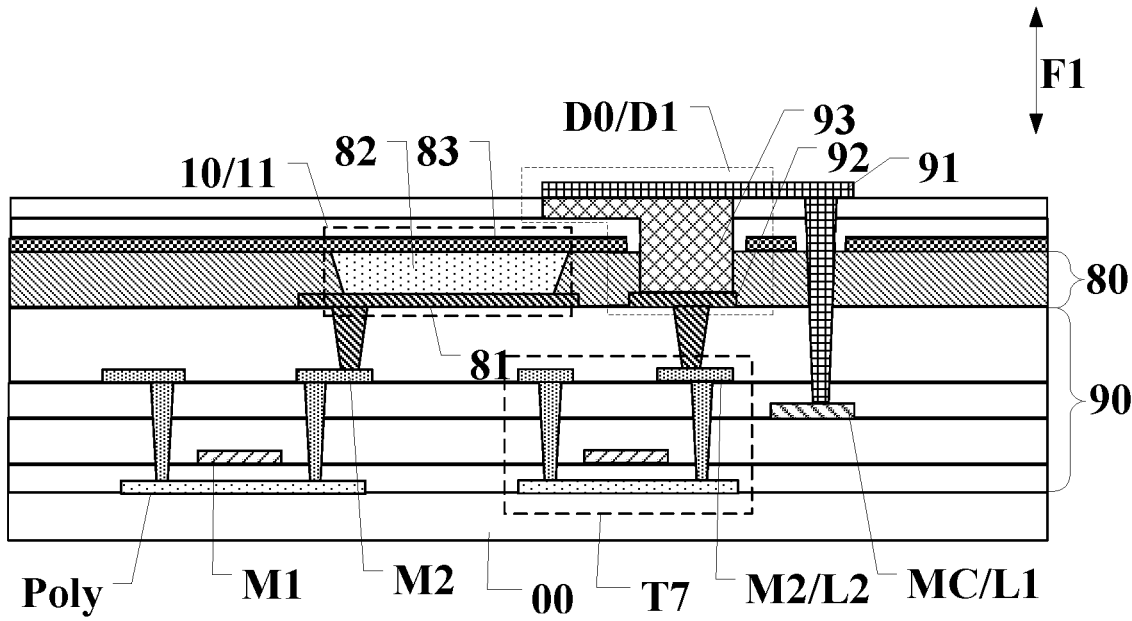
FIG. 25 shows another schematic diagram of a layer structure of a display panel according to various disclosed embodiments of the present disclosure.

FIG. 22 illustrates another schematic diagram of connections between photo-sensing elements and feedback circuits according to the present disclosure. FIG. 23 illustrates a schematic voltage timing diagram of an on-signal control terminal according to the present disclosure. FIG. 24 illustrates a schematic layout diagram of pixel circuits and signal lines in the optical detection units according to the present disclosure. FIG. 25 illustrates another schematic diagram of a layer structure of the display panel according to the present disclosure. The feedback circuit further includes a first control transistor in some cases.

Referring to FIGS. 22-25, the feedback circuit also includes an on-signal control terminal and a first control transistor T7. The input end of the photo-sensing element D0 is connected to the control signal line L1 through the first control transistor T7. The control ends of the first control transistors T7 corresponding to the photo-sensing elements D0 located in the same row along the second direction F2 are connected to the same on-signal control end (Gn, Gn+1, Gn+2, etc.).

In some embodiments, the first control transistor T7 is arranged between the input end of the photo-sensing element D0 and the control signal line L1. The control end of the first control transistor T7 is connected to the on-signal control end. In the timing diagram shown in FIG. 23, Gn, Gn+1, and Gn+2 respectively represent voltages on the on-signal control terminals connected to the first control transistors T7 of the nth row, (n+1)th row, and (n+2)th row. When the first control transistor T7 is arranged, the brightness detection time of the light-emitting elements conducted by a photo-sensing element D0 is controlled by a conduction time of the first control transistor T7 corresponding to the photo-sensing element D0. In some embodiments, the first control transistors T7 in different rows are turned on at different times. Then, the photo-sensing elements D0 in different rows perform brightness detection at the different times. When the first control transistors T7 are arranged, signals on each control signal line L1 are converted into DC global signals (e.g., signals transmitted on each control signal line L1 are the voltage signal V1). That is, each control signal line L1 is connected to the same signal terminal of the control chip IC. It is beneficial to reducing the number of signal terminals on the control chip IC connected to the control signal lines L1 in the feedback circuit, and is beneficial to reducing the production cost of the control chip. When the first control transistor T7 is introduced in the display panel, the first control transistor T7 may be fabricated using the same process as some other transistors in the display panel. It simplifies the manufacturing process when the first control transistors T7 are made. Referring to FIG. 24, the first transistor T7 in the layout diagram is located on a side of the data line in the pixel circuit away from the power signal line PVDD, i.e., an area between two adjacent pixel circuits along the second direction F2. When a photo-sensing element is introduced into the display panel, the photo-sensing element may also be disposed in an area between two adjacent pixel circuits along the second direction F2 in some cases.

Referring to FIGS. 13 and 22, the display area also includes the third display area A3. The first display area A1 at least partially surrounds the third display area A3. The first control transistor T7 is located in the first display area A1. When the first control transistor is introduced in the feedback circuit, the first control transistor in the feedback circuit corresponding to the third display area A3 is disposed in the first display area A1. It may avoid affecting the transmittance of the third display area A3 when the first control transistors are arranged in the third display area A3, and is beneficial to improve the transmittance of the third display area A3.

When the feedback circuit includes the first control transistor, the first control transistor may be manufactured simultaneously with existing transistors in the display panel to simplify the fabrication process of the display panel, and improve the production efficiency of the display panel. In FIG. 22, the first control transistor is exemplarily a P-type transistor for illustration, which does not limit the type of the first control transistor. For example, the first control transistor may also be embodied as an N-type transistor in some other cases.

Figure 26:
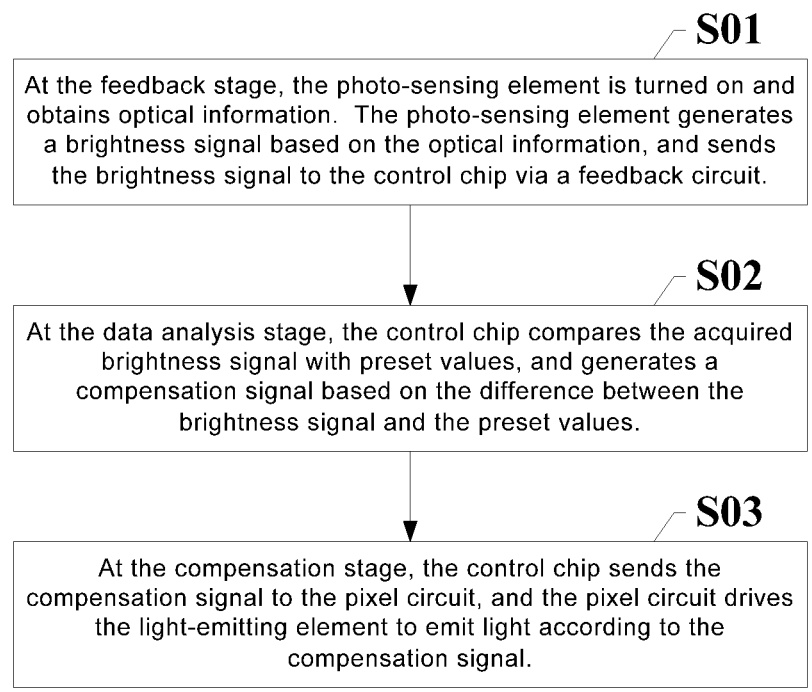
FIG. 26 shows a flow chart of an optical compensation method according to various disclosed embodiments of the present disclosure.

FIG. 26 illustrates a flow chart of an optical compensation method according to the present disclosure. The optical compensation method is provided for performing optical compensation for the display panel 100 illustrated above. The display panel includes a control chip, a photo-sensing element, a feedback circuit electrically connected to the photo-sensing element, a light-emitting element, and a pixel circuit electrically connected to the light-emitting element. The photo-sensing element is electrically connected to the control chip through the feedback circuit. The light-emitting element is electrically connected to the control chip through the pixel circuit. The optical compensation method includes a feedback stage S01, a data analysis stage S02, and a compensation stage S03 in some embodiments.

At S01, the photo-sensing element is turned on and obtains optical information. The photo-sensing element generates a brightness signal based on the optical information and sends the brightness signal to the control chip through the feedback circuit.

At S02, the control chip compares the acquired brightness signal with preset values, and generates a compensation signal based on the difference between the brightness signal and the preset values.

At S03, the control chip sends the compensation signal to the pixel circuit, and the pixel circuit drives the light-emitting element to emit light according to the compensation signal.

In some embodiments, a photo-sensing element is arranged in the display area. When turned on, the photo-sensing element collects the brightness information of corresponding light-emitting elements, converts the optical signal into a brightness signal, and then transmits the brightness signal to a control chip through a feedback circuit. The control chip analyzes the brightness signal, compares the brightness signal with preset values to generate a compensation signal, and sends the compensation signal to a pixel circuit corresponding to the light-emitting element. The light-emitting element emits light according to a brightness signal made after compensation. Through incorporating the photo-sensing elements, feedback circuits, and control chip, compensation for the luminous brightness in the first display area is achieved. It effectively improves the display brightness uniformity of different display areas in the display panel.

Figure 27:
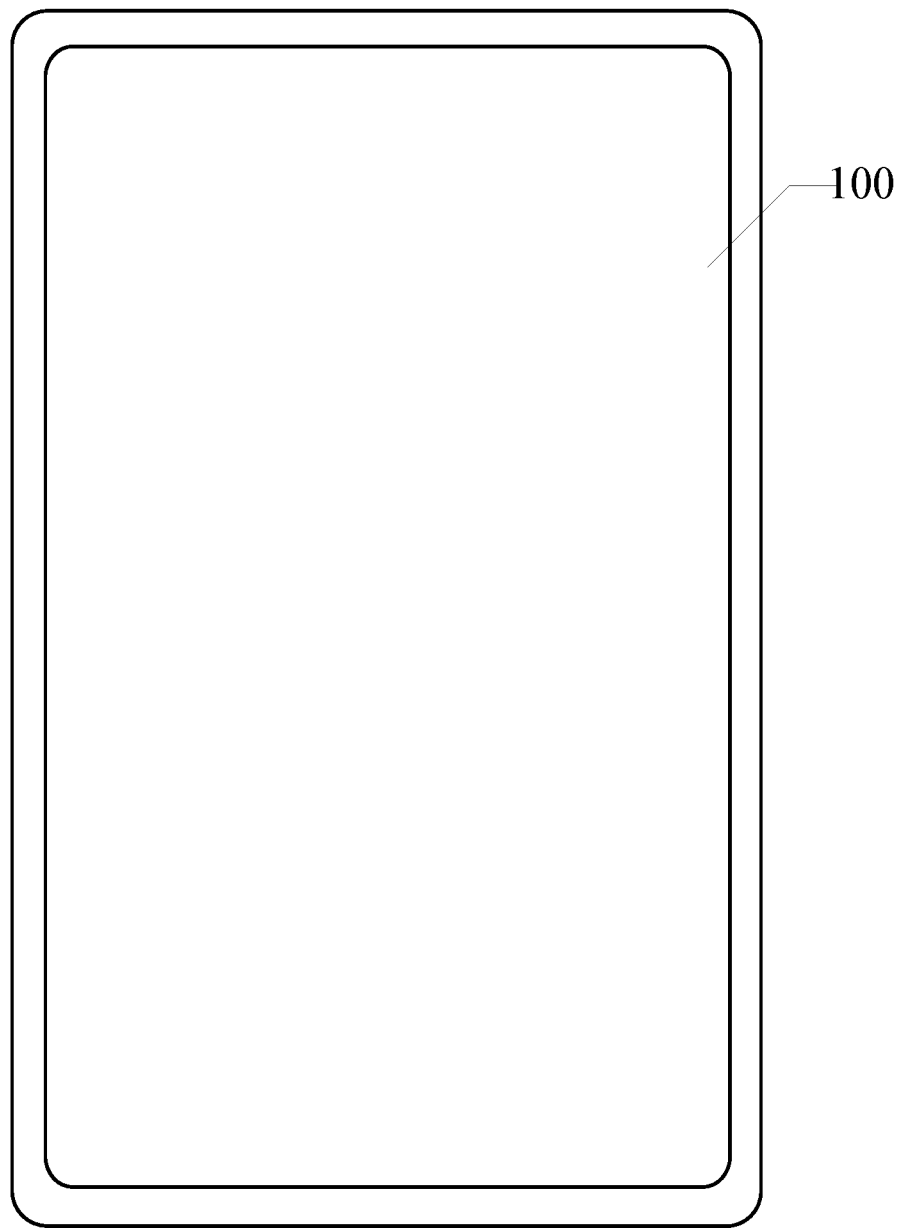
FIG. 27 shows a schematic top view of a display device according to various disclosed embodiments of the present disclosure.

FIG. 27 illustrates a schematic top view of a display device 200 according to the present disclosure. The display device 200 includes the display panel 100 illustrated in the above embodiments.

The display device 200 includes any electronic device with a display function such as a touch screen, a mobile phone, a tablet computer, a laptop computer, an e-book, television, etc. The display device 200 has the beneficial effects of the display panel 100 provided by the embodiments of the present disclosure. FIG. 27 illustrates a rounded rectangular shape as an exemplary shape of the display device 200. Alternatively, the display device 200 may also have other shapes such as a rectangle, a circle, and an oval.

The display panel, display device, and optical compensation method provided by the present disclosure at least achieve the following beneficial effects:

A display panel and a display device each include a display area that contains a first display area and a second display area. The second display area at least partially surrounds the first display area. The first display area is an optical device area used for arranging optical devices. A first pixel circuit is electrically connected to a first light-emitting element in the first display area. A second pixel circuit is electrically connected to a second light-emitting element in the second display area. The number of the first light-emitting elements connected to the first pixel circuit is greater than the number of the second light-emitting elements connected to the second pixel circuit, which ensures that the transmittance of the first display area is higher than that of the second display area and the transmittance requirement of the first display area is met. Further, a first optical detection unit is arranged in the first display area. The first optical detection unit is used to detect the brightness of the first light-emitting elements in the first display area. When it is detected that the brightness of the first light-emitting elements is lower than the brightness of the second light-emitting elements in the second display area, an optical compensation method provided by the present disclosure is used to compensate for the luminous brightness of the first light-emitting elements in the first display area. As such the difference in display brightness between the first and second display areas is balanced. It helps improve the overall display brightness uniformity of the display area and improve the overall display effect of the display panel.

The embodiments disclosed herein are exemplary only. Other applications, advantages, alternations, modifications, or equivalents to the disclosed embodiments are obvious to those skilled in the art and are intended to be encompassed within the scope of the present disclosure. The scope of the present disclosure is defined by the appended claims.

What is claimed is:

1. A display panel, comprising:
    a display area, the display area including a first display area and a second display area, the second display area at least partially surrounding the first display area;
    a light-emitting element, the light-emitting element including a plurality of first light-emitting elements located in the first display area and a plurality of second light-emitting elements located in the second display area;
    a pixel circuit, the pixel circuit including a first pixel circuit and a second pixel circuit, the first pixel circuit electrically connected to at least one of the plurality of first light-emitting elements, the second pixel circuit electrically connected to at least one of the plurality of second light-emitting elements, and a number of the first light-emitting element connected to the first pixel circuit being greater than a number of the second light-emitting element connected to the second pixel circuit;
    an optical detection unit, the optical detection unit including a first optical detection unit in the first display area, the first optical detection unit used for detecting brightness of at least one of the plurality of first light-emitting elements in the first display area; and
    a third display area, wherein
        the first display area at least partially surrounds the third display area, the light-emitting element further includes a plurality of third light-emitting elements located in the third display area, the pixel circuit includes a third pixel circuit connected to one of the plurality of third light-emitting elements, and the third pixel circuit and the first pixel circuit are both located in the first display area;
        the optical detection unit further includes a second optical detection unit located in the third display area, and the second optical detection unit is used to detect brightness of at least one of the plurality of third light-emitting elements in the third display area; and the first optical detection unit includes a third photo-sensing element, the second optical detection unit includes a plurality of fourth photo-sensing elements, the third photo-sensing element does not overlap with the plurality of first light-emitting elements along a first direction, the third photo-sensing element is adjacent to one of the plurality of first light-emitting elements along a second direction, at least one of the plurality of fourth photo-sensing elements overlaps one of the plurality of third light-emitting elements along the first direction, the first direction is perpendicular to a plane where the display panel is located, and the second direction is parallel to the plane where the display panel is located.

2. The display panel according to claim 1, wherein the optical detection unit has no physical electrical connection with the pixel circuit.

3. The display panel according to claim 1, further comprising:

a control chip, wherein the optical detection unit further includes a photo-sensing element and a feedback circuit connected to the photo-sensing element, the photo-sensing element is used to receive a brightness signal of the light-emitting element and transmit the brightness signal to the feedback circuit, the pixel circuit and the feedback circuit are both electrically connected to the control chip, and the control chip is used to receive the brightness signal transmitted by the feedback circuit, generate a driving signal according to the brightness signal, and send the driving signal to the pixel circuit corresponding to the light-emitting element.

4. The display panel according to claim 1, wherein the first optical detection unit includes a photo-sensing element, the photo-sensing element includes a plurality of first photo-sensing elements, at least one of the plurality of first photo-sensing elements overlaps one of the plurality of first light-emitting element in the first display area along a first direction, and the first direction is perpendicular to a plane where the display panel is located.

5. The display panel to claim 4, wherein the plurality of first photo-sensing elements include a first sub-photo-sensing element and a second sub-photo-sensing element, the first sub-photo-sensing element is located on a side of the second sub-photo-sensing element close to the second display area, and a number of the first light-emitting element corresponding to the first sub-photo-sensing element is smaller than a number of the first light-emitting element corresponding to the second sub-photo-sensing element.

6. The display panel according to claim 4, wherein the photo-sensing element further includes a second photo-sensing element, the second photo-sensing element and the plurality of first light-emitting elements do not overlap along the first direction, the second photo-sensing element is adjacent to one of the plurality of first light-emitting elements along a second direction, the second direction is parallel to the plane where the display panel is located, and the second photo-sensing element is located on a side of the first photo-sensing element away from the second display area.

7. The display panel according to claim 1, wherein the plurality of first light-emitting elements located in the first display area includes a red light-emitting element, a green light-emitting element, and a blue light-emitting element, and the first optical detection unit is used to detect brightness of the green light-emitting element in the first display area.

8. The display panel according to claim 1, wherein the first optical detection unit includes a plurality of third photo-sensing elements, the second optical detection unit includes a plurality of fourth photo-sensing elements, and an arrangement density of the third photo-sensing element is greater than an arrangement density of the fourth photo-sensing element.

9. The display panel according to claim 1, wherein the second optical detection unit includes a fourth photo-sensing element, the fourth photo-sensing element is used to sense brightness of at least one of the plurality of third light-emitting element, the fourth photo-sensing element includes a third sub-photo-sensing element and a fourth sub-photo-sensing element, the third sub-photo-sensing element is located on a side of the fourth sub-photo-sensing element close to the first display area, a number of the third light-emitting element corresponding to the third sub-photo-sensing element is smaller than a number of the third light-emitting element corresponding to the fourth sub-photo-sensing element.

10. The display panel according to claim 1, wherein the optical detection unit further includes a plurality of photo-sensing elements and a feedback circuit connected to the plurality of photo-sensing elements, the feedback circuit includes a plurality of control signal lines and a plurality of detection signal lines, an input end of one of the plurality of control signal lines is electrically connected to an enable signal end, an output end of one of the plurality of control signal lines is electrically connected to an input end of one of the plurality of photo-sensing elements, and an output end of one of the plurality of photo-sensing elements is connected to a control chip through one of the plurality of detection signal lines.

11. The display panel according to claim 10, wherein the plurality of control signal lines extends along a second direction and is arranged along a third direction, the plurality of detection signal lines extends along the third direction and is arranged along a second direction, the second direction and the third direction intersect, more than one of the plurality of photo-sensing elements located in a same row along the second direction are electrically connected to one of the plurality of control signal lines, and more than one of the plurality of photo-sensing elements located in a same column along the third direction are electrically connected to one of the plurality of detection signal lines.

12. The display panel according to claim 10, further comprising:

a first fixed potential signal line; and a second fixed potential signal line, wherein first and second fixed potential signal lines are electrically connected to the pixel circuit, the first fixed potential signal line extends along a second direction, the second fixed potential signal line extends along a third direction, and the second direction intersects with the third direction, the plurality of control signal lines and the first fixed potential signal line are in a same layer and arranged adjacently, and the plurality of detection signal lines and the second fixed potential signal line are in a same layer and arranged adjacently.

13. The display panel according to claim 10, further comprising:

a plurality of signal traces electrically connected to the pixel circuit, wherein a layer where the plurality of control signal lines and the plurality of detection signal lines are located is different from a layer where the plurality of signal traces is located.

14. The display panel according to claim 10, wherein the feedback circuit further includes an on-signal control terminal and a first control transistor, and an input end of one of the plurality of photo-sensing elements is connected to one of the plurality of control signal lines through the first control transistor.

15. The display panel according to claim 14, wherein the display area further includes a third display area, the first display area at least partially surrounds the third display area, and the first control transistor is located in the first display area.

16. An optical compensation method for the display panel according to claim 1, the display panel further including a control chip, a photo-sensing element, a feedback circuit electrically connected to the photo-sensing element, a light-emitting element, and a pixel circuit electrically connected to the light-emitting element, the photo-sensing element electrically connected to the control chip through the feedback circuit, the light-emitting element electrically connected to the control chip through the pixel circuit, the method comprising:
  a feedback stage;
  a data analysis stage; and
  a compensation stage, wherein at the feedback stage, the photo-sensing element is turned on, obtains optical information, generates a brightness signal according to the optical information, and sends the brightness signal to the control chip through the feedback circuit; at the data analysis stage, the control chip compares the brightness signal with a preset value, and generates a compensation signal based on a difference between the brightness signal and the preset value; and at the compensation stage, the control chip sends the compensation signal to the pixel circuit, and the pixel circuit drives the light-emitting element to emit light according to the compensation signal.

17. A display device, comprising:
  a display panel, wherein the display panel includes:
    a display area, the display area including a first display area and a second display area, the second display area at least partially surrounding the first display area;
    a light-emitting element, the light-emitting element including a plurality of first light-emitting elements located in the first display area and a plurality of second light-emitting elements located in the second display area;
    a pixel circuit, the pixel circuit including a first pixel circuit and a second pixel circuit, the first pixel circuit electrically connected to at least one of the plurality of first light-emitting elements, the second pixel circuit electrically connected to at least one of the plurality of second light-emitting elements, and a number of the first light-emitting element connected to the first pixel circuit being greater than a number of the second light-emitting elements connected to the second pixel circuit;
  an optical detection unit, the optical detection unit including a first optical detection unit in the first display area, the first optical detection unit used for detecting brightness of at least one of the plurality of first light-emitting elements in the first display area; and
  a third display area, wherein
    the first display area at least partially surrounds the third display area, the light-emitting element further includes a plurality of third light-emitting elements located in the third display area, the pixel circuit includes a third pixel circuit connected to one of the plurality of third light-emitting elements, and the third pixel circuit and the first pixel circuit are both located in the first display area;
    the optical detection unit further includes a second optical detection unit located in the third display area, and the second optical detection unit is used to detect brightness of at least one of the plurality of third light-emitting elements in the third display area; and
    the first optical detection unit includes a third photo-sensing element, the second optical detection unit includes a plurality of fourth photo-sensing elements, the third photo-sensing element does not overlap with the plurality of first light-emitting elements along a first direction, the third photo-sensing element is adjacent to one of the plurality of first light-emitting elements along a second direction, at least one of the plurality of fourth photo-sensing elements overlaps one of the plurality of third light-emitting elements along the first direction, the first direction is perpendicular to a plane where the display panel is located, and the second direction is parallel to the plane where the display panel is located.

* * * * *